US009070743B2

(12) United States Patent  
Kato et al.

(10) Patent No.: US 9,070,743 B2  
(45) Date of Patent: Jun. 30, 2015

(54) SEMICONDUCTOR MEMORY AND MANUFACTURING METHOD OF THE SAME

(75) Inventors: Yoshiko Kato, Yokohama (JP); Masato Endo, Yokohama (JP); Mitsuhiko Noda, Yokohama (JP); Mitsuhiro Noguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 583 days.

(21) Appl. No.: 13/413,952

(22) Filed: Mar. 7, 2012

(65) Prior Publication Data

US 2013/0062680 A1    Mar. 14, 2013

(30) Foreign Application Priority Data

Sep. 14, 2011    (JP) ................................. 2011-200584

(51) Int. Cl.
| | |
|---|---|
| *H01L 29/788* | (2006.01) |
| *H01L 21/762* | (2006.01) |
| *H01L 29/66* | (2006.01) |
| *H01L 29/792* | (2006.01) |
| *H01L 27/115* | (2006.01) |

(52) U.S. Cl.
CPC .... *H01L 21/76229* (2013.01); *H01L 29/66825* (2013.01); *H01L 29/66833* (2013.01); *H01L 29/7881* (2013.01); *H01L 29/792* (2013.01); *H01L 27/11519* (2013.01); *H01L 27/11529* (2013.01); *H01L 27/11546* (2013.01); *H01L 27/11565* (2013.01); *H01L 27/1157* (2013.01); *H01L 27/11573* (2013.01)

(58) Field of Classification Search
CPC ................. H01L 29/66825; H01L 29/66833; H01L 29/792

USPC ........................ 257/316, 315, E29.3, E29.309  
See application file for complete search history.

(56) References Cited

U.S. PATENT DOCUMENTS

| 7,994,587 B2 | 8/2011 | Endo et al. |
|---|---|---|
| 2006/0014340 A1* | 1/2006 | Matsumori ................... 438/221 |
| 2007/0102731 A1 | 5/2007 | Sakagami |

(Continued)

FOREIGN PATENT DOCUMENTS

| JP | 2006-5087 A | 1/2006 |
|---|---|---|
| JP | 2007-129136 A | 5/2007 |

(Continued)

OTHER PUBLICATIONS

U.S. Appl. No. 13/428,430, filed Mar. 23, 2012, Endo, et al.

(Continued)

*Primary Examiner* — Minchul Yang  
(74) *Attorney, Agent, or Firm* — Oblon, McClelland, Maier & Neustadt, L.L.P.

(57) ABSTRACT

According to one embodiment, a semiconductor memory includes a memory cell in a memory cell array which is provided in a semiconductor substrate and which includes a first active region surrounded by a first isolation insulator, a transistor in a transistor region which is provided in the semiconductor substrate and which includes second active regions surrounded by a second isolation insulator. The second isolation insulator includes a first film, and a second film between the first film and the second active region, and the upper surface of the first film is located closer to the bottom of the semiconductor substrate than the upper surface of the second film.

18 Claims, 20 Drawing Sheets

(56) References Cited

U.S. PATENT DOCUMENTS

2008/0157092 A1* 7/2008 Arai et al. .................. 257/67
2010/0006946 A1   1/2010 Endo
2010/0013028 A1   1/2010 Kato et al.

FOREIGN PATENT DOCUMENTS

| JP | 2010-21493 A | 1/2010 |
| JP | 2010-27656 | 2/2010 |
| JP | 2011-29383 A | 2/2011 |
| JP | 2011-200585 | 10/2011 |

OTHER PUBLICATIONS

Japanese Office Action issued Jan. 28, 2014 in Patent Application No. 2011-200584 with English Translation.

* cited by examiner

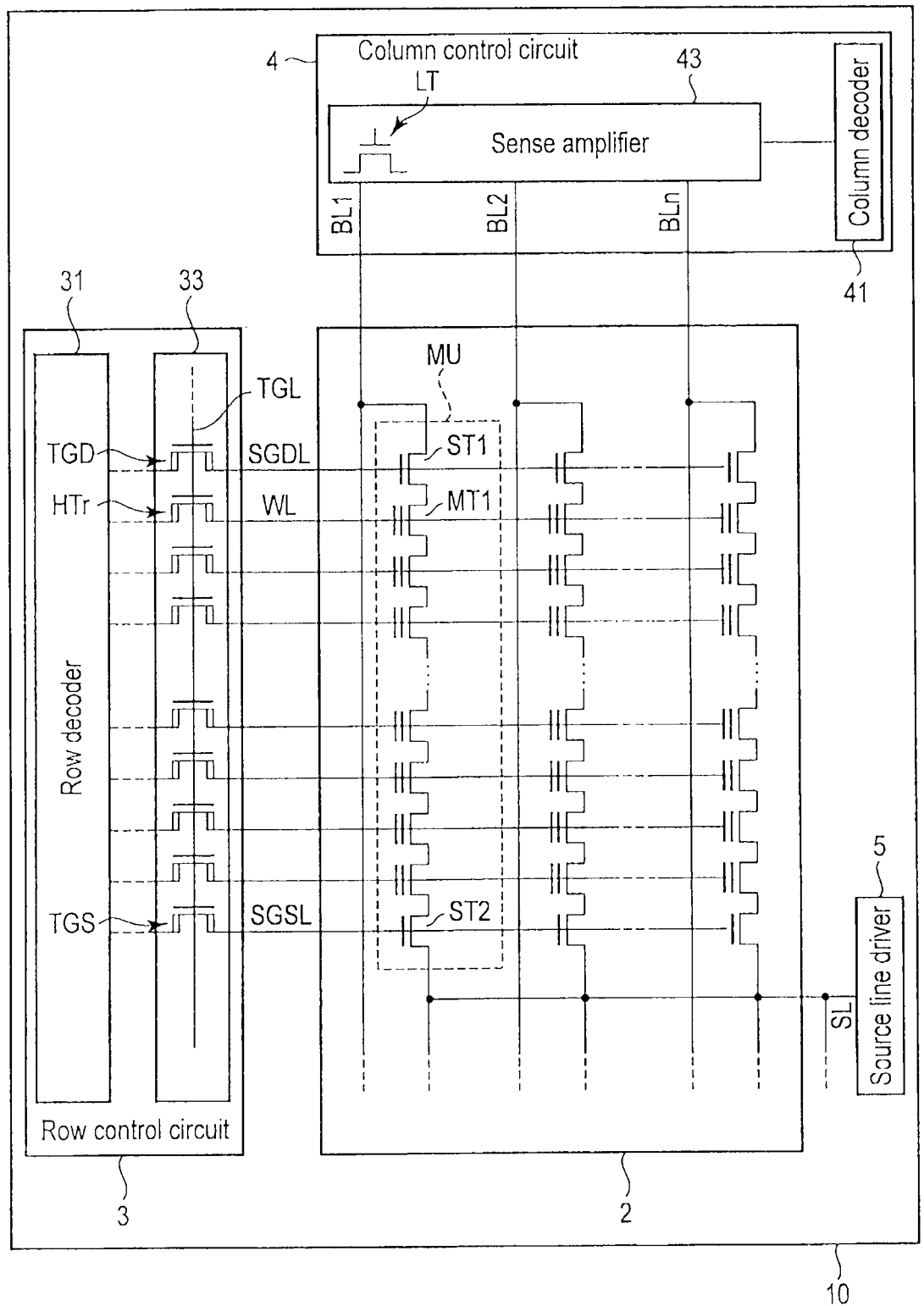
F I G. 1

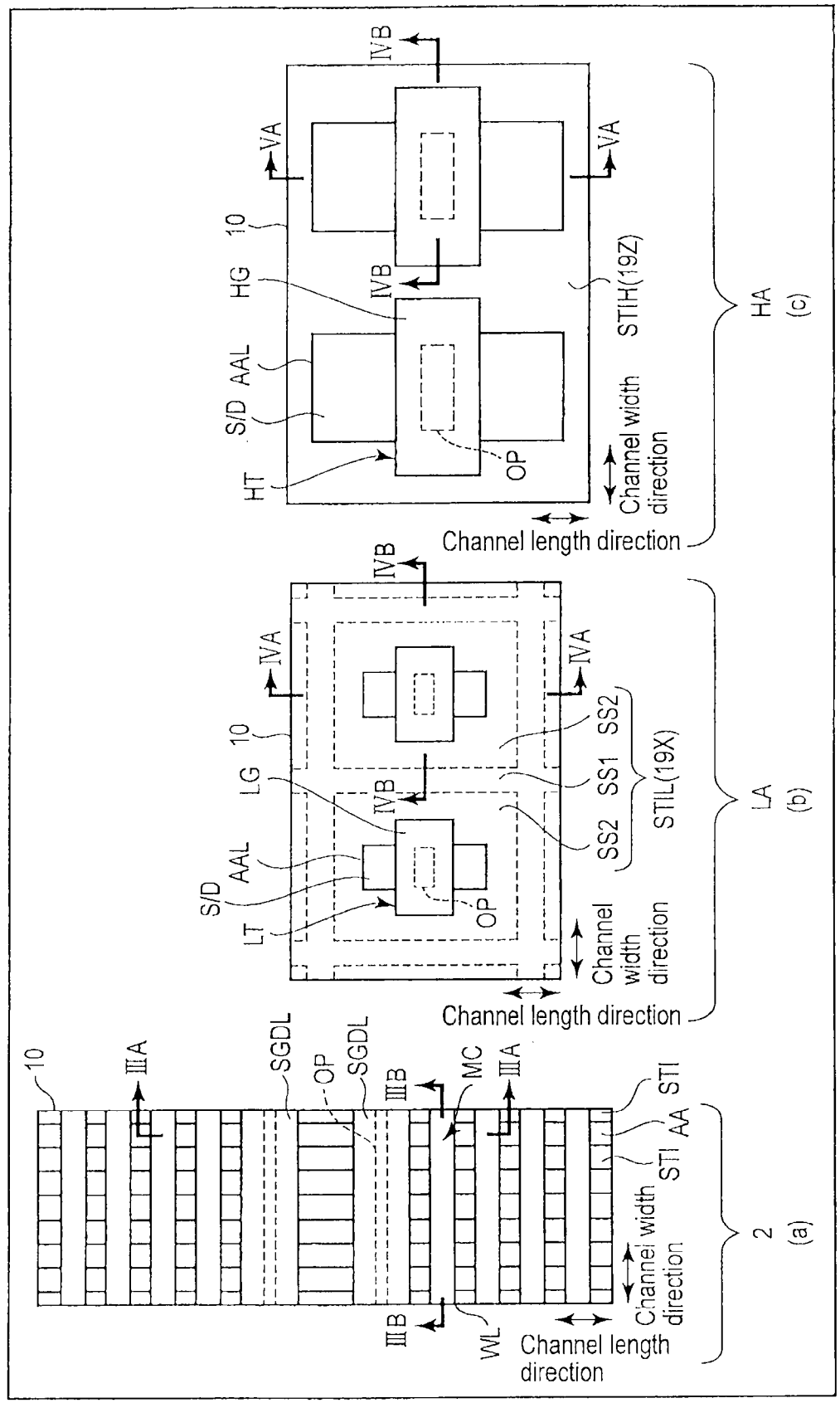
F I G. 2

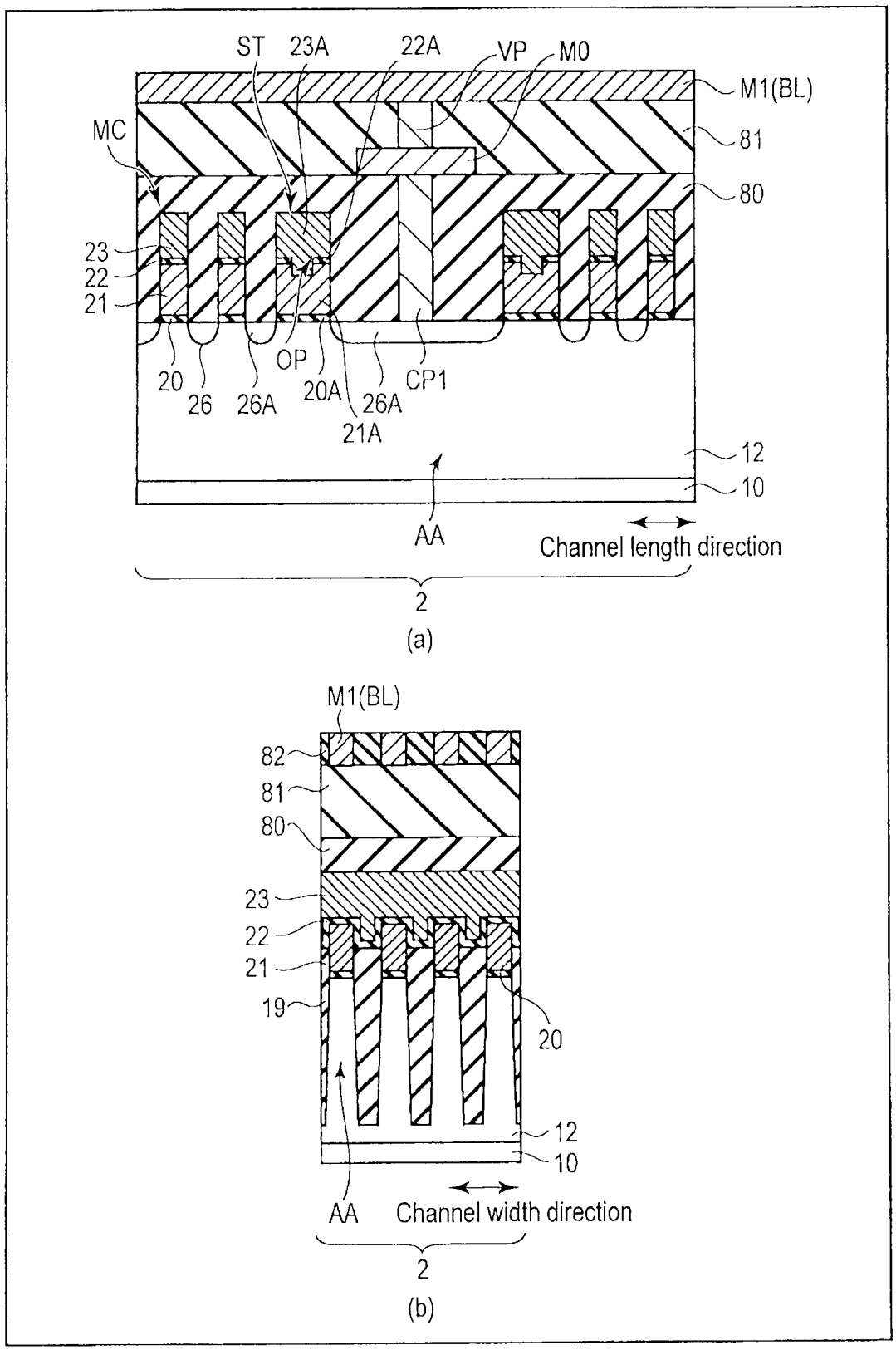
F I G. 3

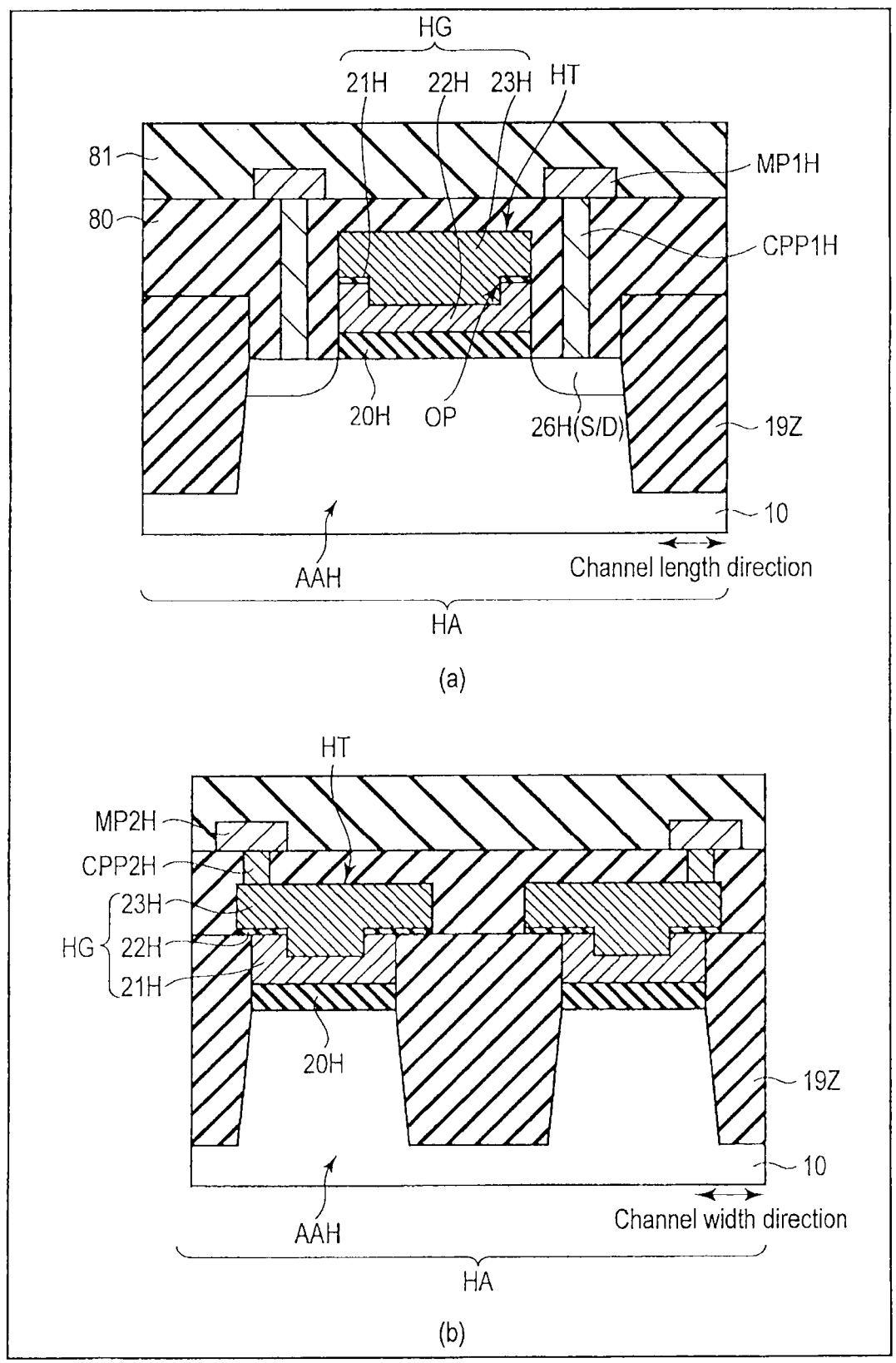
F I G. 5

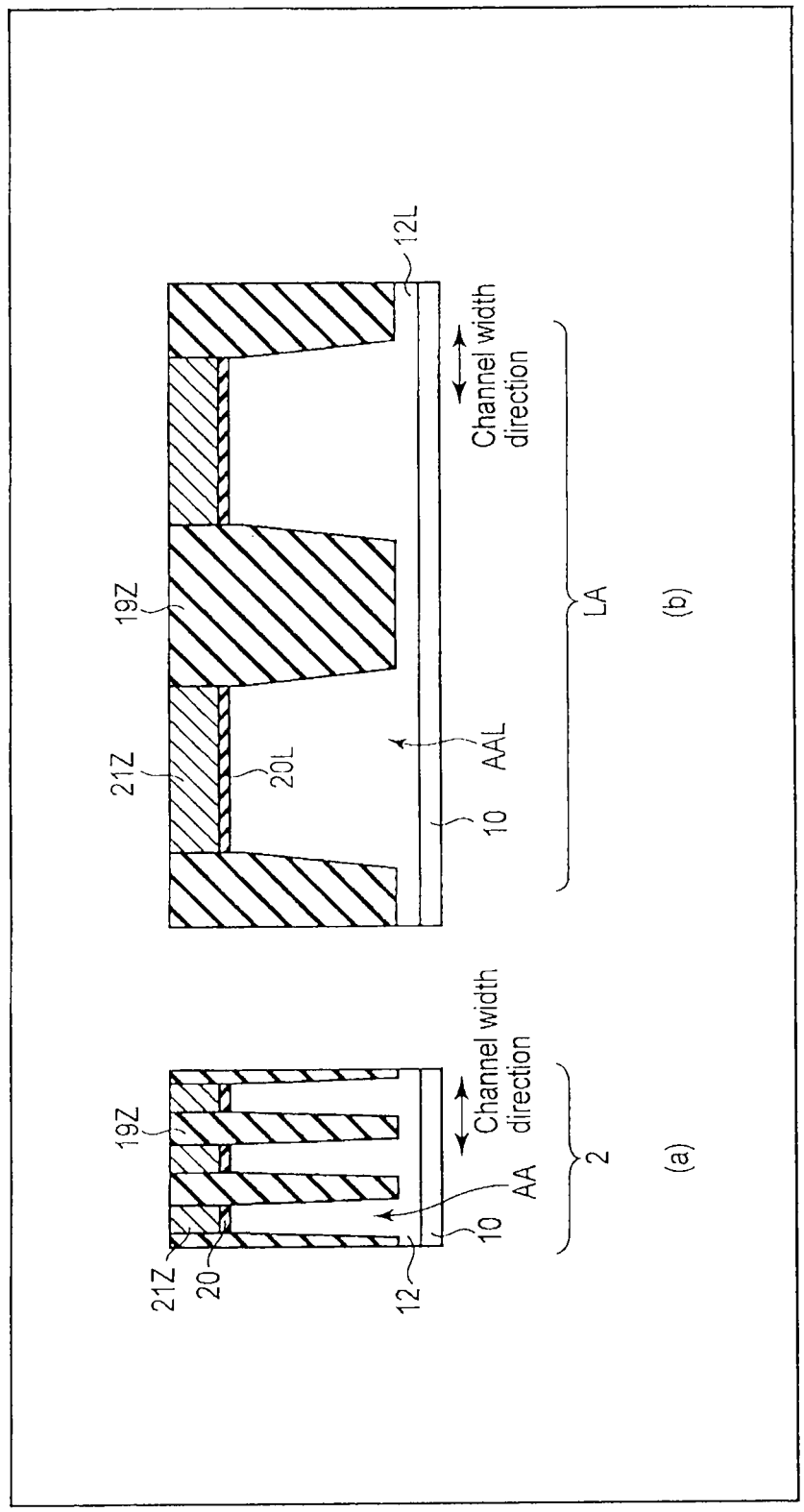
F I G. 9

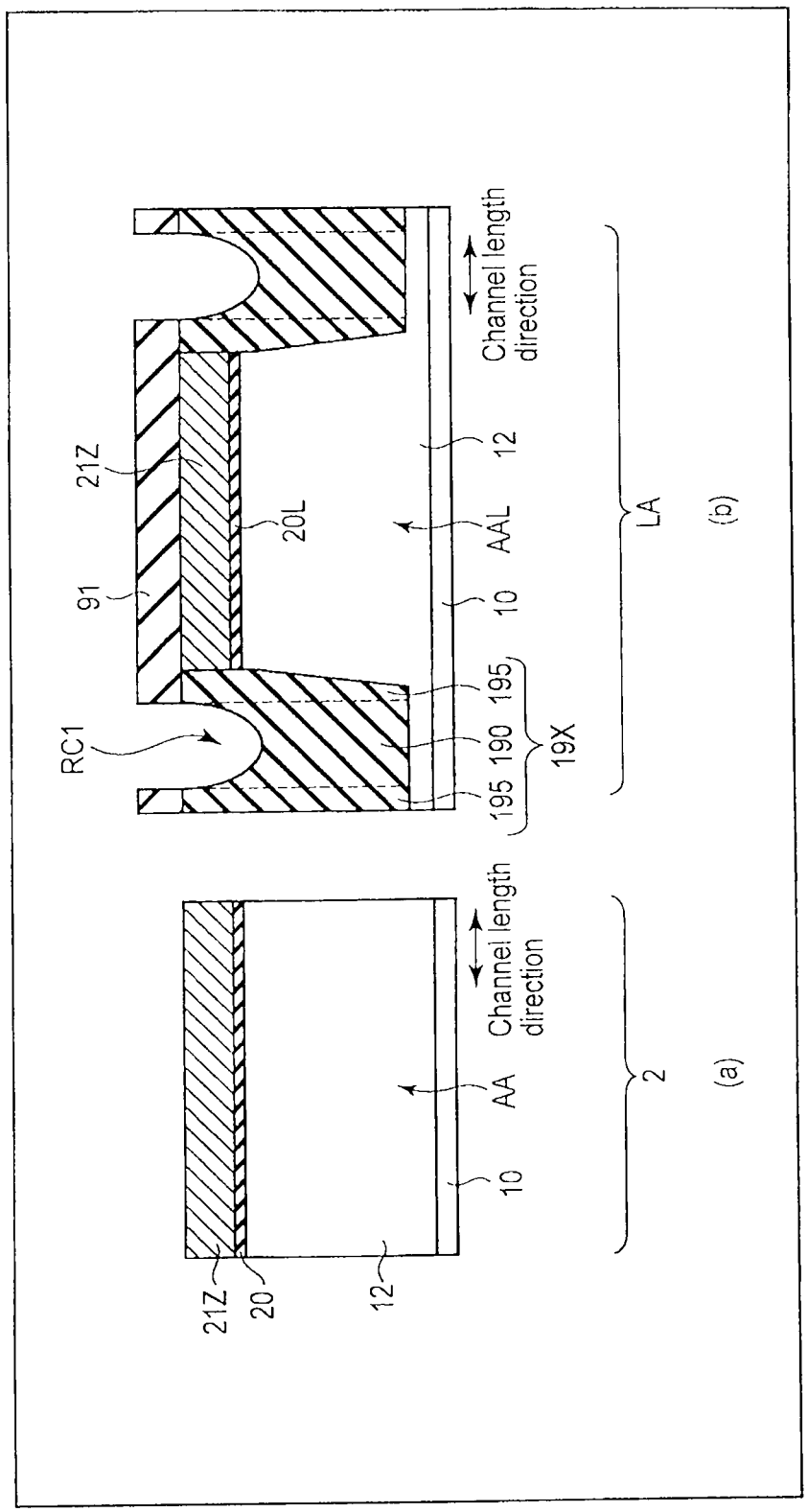
F I G. 10

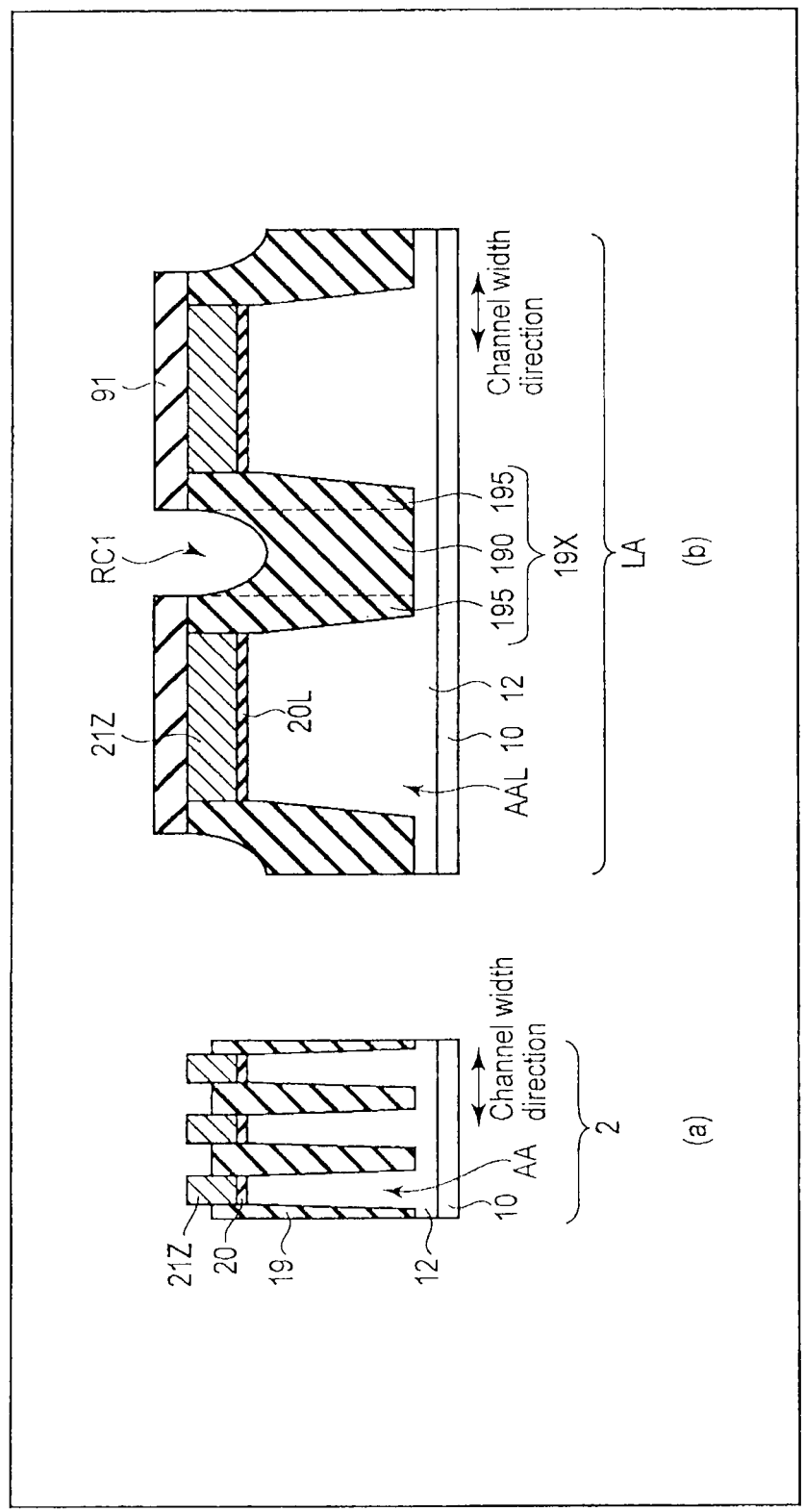
F I G. 11

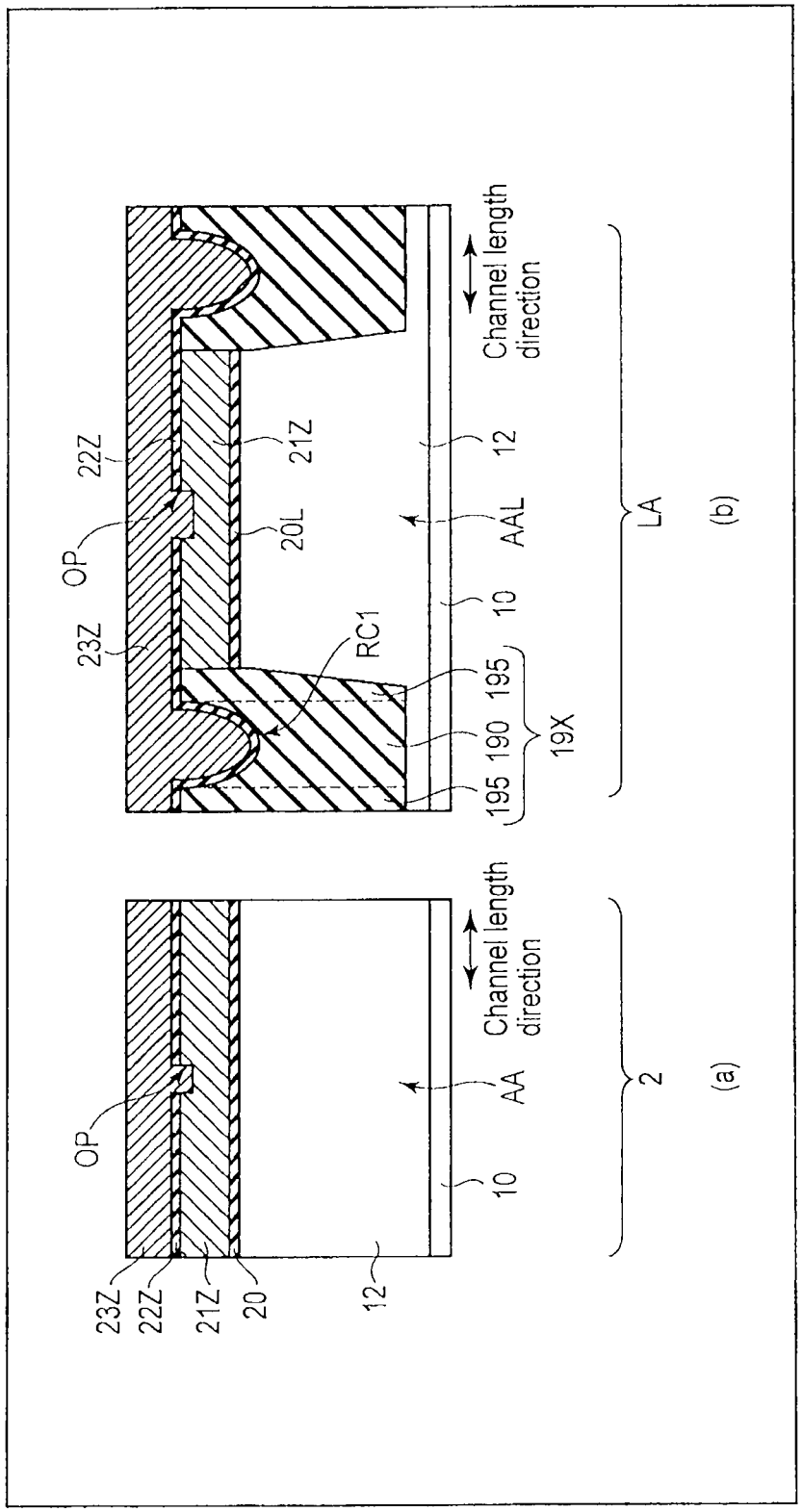
F I G. 12

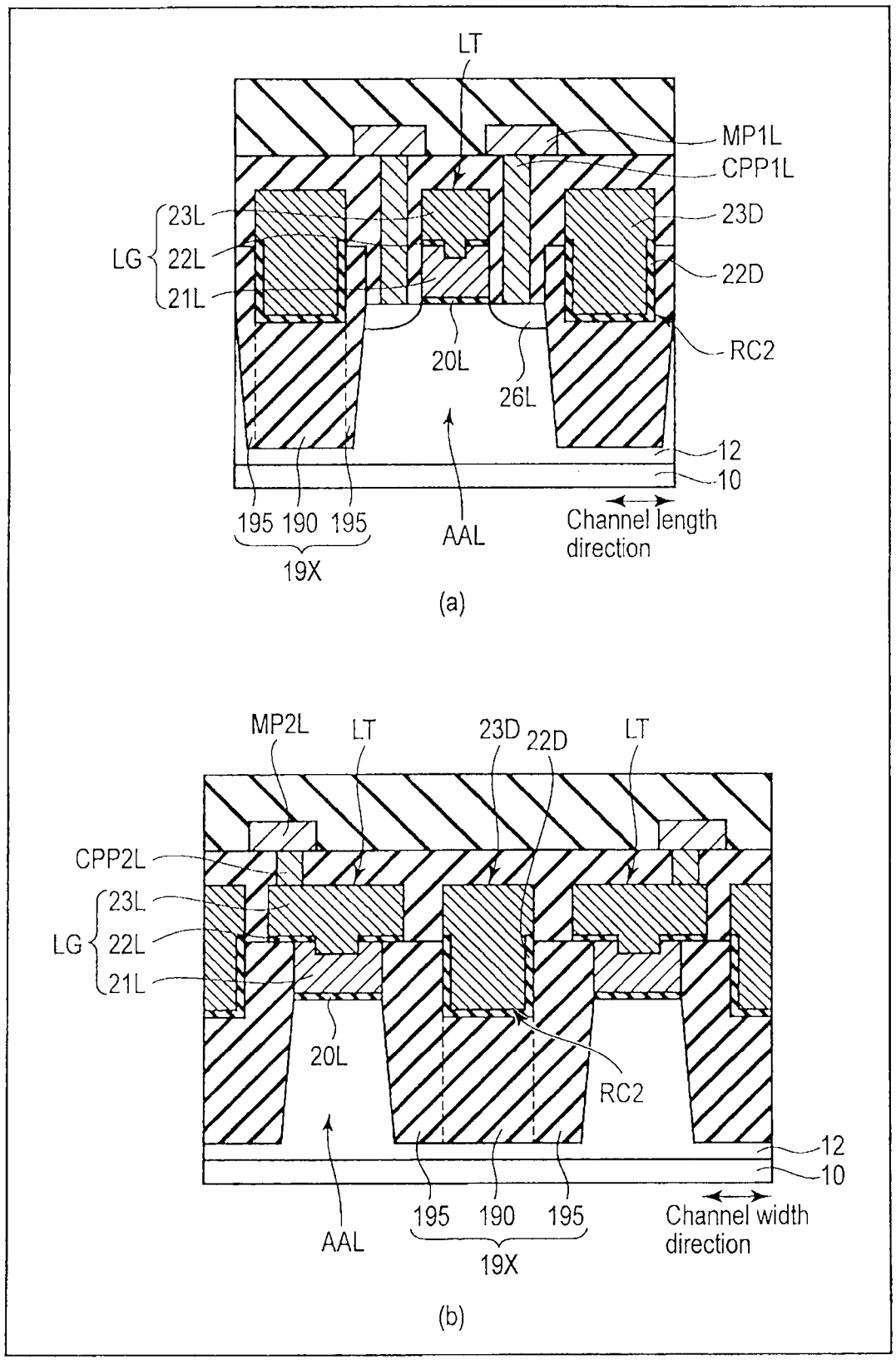
F I G. 16

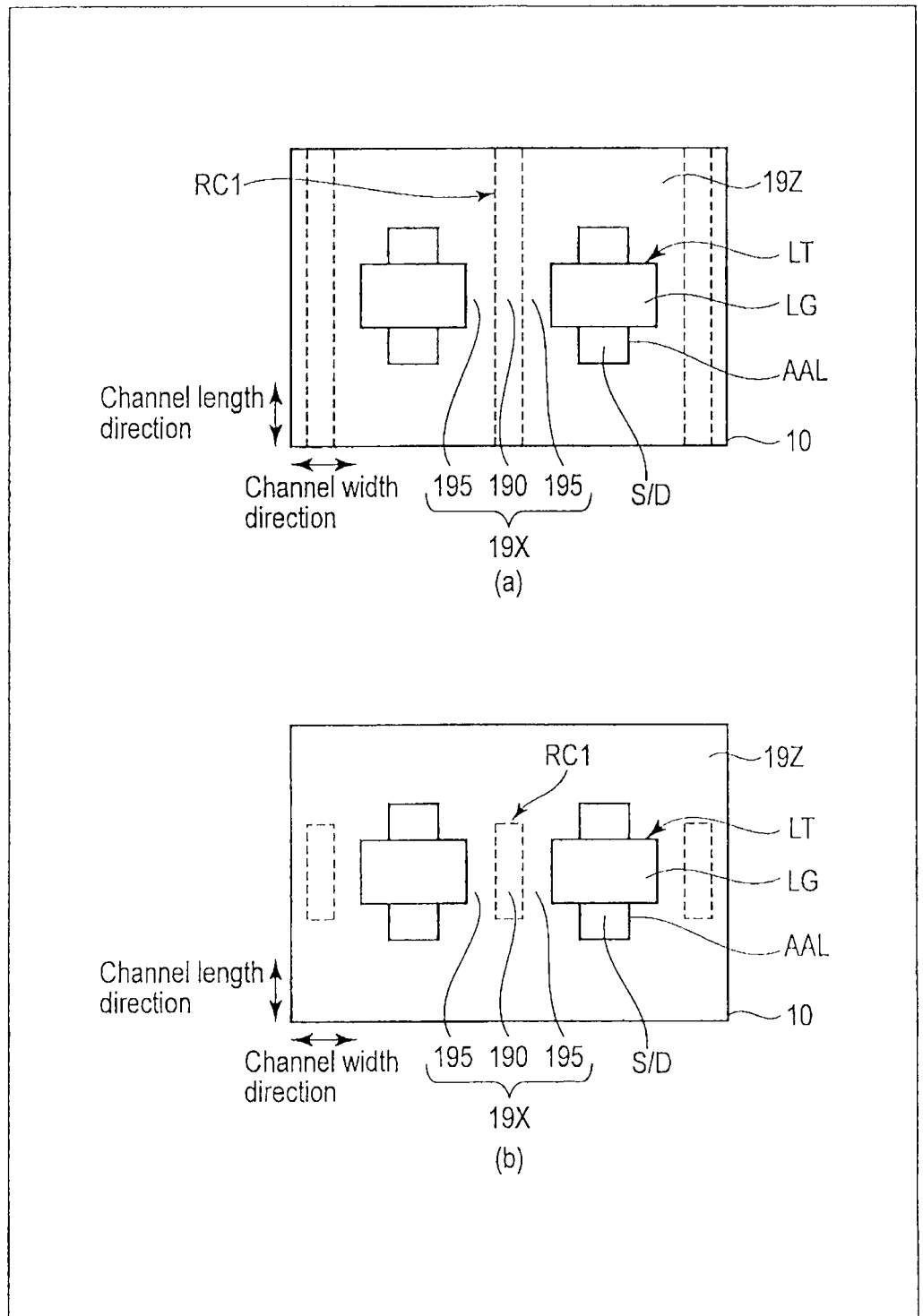
F I G. 20

SEMICONDUCTOR MEMORY AND MANUFACTURING METHOD OF THE SAME

CROSS-REFERENCE TO RELATED APPLICATIONS

This application is based upon and claims the benefit of priority from prior Japanese Patent Application No. 2011-200584, filed Sep. 14, 2011, the entire contents of which are incorporated herein by reference.

FIELD

Embodiments described herein relate generally to a semiconductor memory and a manufacturing method of the same.

BACKGROUND

Element scaling-down in semiconductor memories such as a flash memory has been carried out for higher storage density.

In response to the element scaling-down, a low-viscosity filling material is used as an isolation insulator to fill the space between element regions. The stress of this filling material may produce crystal defects in a semiconductor region as an element region. The crystal defects may deteriorate the characteristics of elements formed in the semiconductor region.

BRIEF DESCRIPTION OF THE DRAWINGS

FIG. 1 is a schematic diagram illustrating the configuration of a semiconductor memory according to embodiments;

FIG. 2 is a plan view illustrating the structure of a semiconductor memory according to a first embodiment;

FIG. 3 is a sectional view illustrating the structure of the semiconductor memory according to the first embodiment;

FIG. 5 is a sectional view illustrating the structure of the semiconductor memory according to the first embodiment;

FIG. 9 is a sectional view illustrating the method of manufacturing the semiconductor memory according to the first embodiment;

FIG. 10 is a sectional view illustrating the method of manufacturing the semiconductor memory according to the first embodiment;

FIG. 11 is a sectional view illustrating the method of manufacturing the semiconductor memory according to the first embodiment;

FIG. 12 is a sectional view illustrating the method of manufacturing the semiconductor memory according to the first embodiment;

FIG. 16 is a sectional view illustrating the structure of a semiconductor memory according to a second embodiment;

FIG. 20 is a diagram illustrating a modification of the semiconductor memory according to the embodiments.

DETAILED DESCRIPTION

Figure 4:
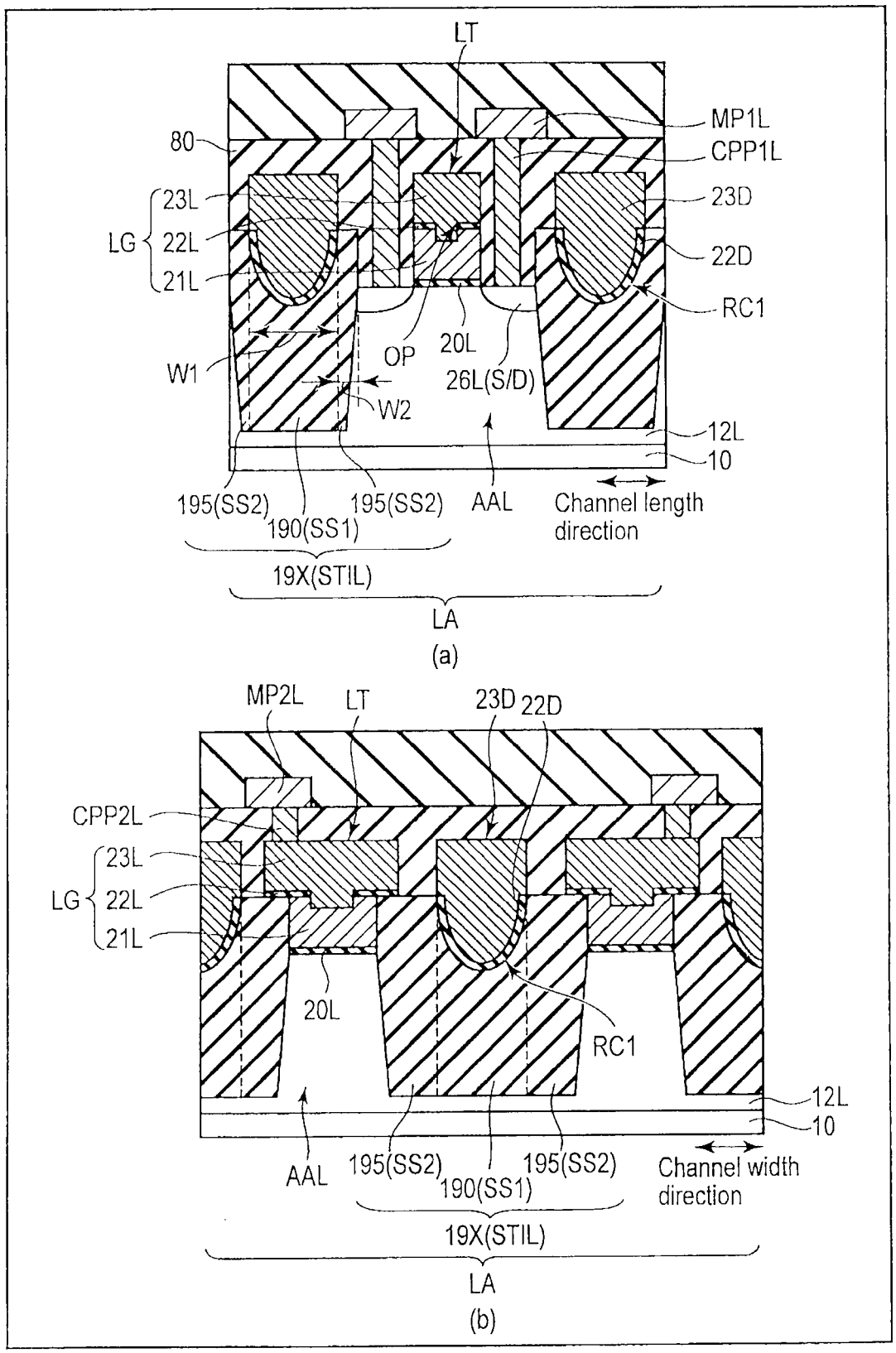
FIG. 4 is a sectional view illustrating the structure of the semiconductor memory according to the first embodiment.

Hereinafter, embodiments will be described in detail with reference to the drawings. Elements having like functions and configurations are given like reference marks throughout the following explanations, and repeated explanations are given when necessary.

In general, according to one embodiment, a semiconductor memory includes a memory cell array which is provided in a semiconductor substrate and which includes a first active region surrounded by a first isolation insulator; a transistor region which is provided in the semiconductor substrate and which includes second active region surrounded by a second isolation insulator; a memory cell in the memory cell array, the memory cell including a first gate insulating film provided on the first active region, a charge storage layer provided on the first gate insulating film, a first insulator provided on the charge storage layer, and a control gate electrode provided on the charge storage layer via the first insulator; and a first transistor in the second active region, the first transistor including a second gate insulating film provided on the second active region, and a first electrode layer provided on the second gate insulating film. The second isolation insulator includes a first film, and a second film between the first film and the second active region, and the upper surface of the first film is located closer to the bottom of the semiconductor substrate than the upper surface of the second film.

EMBODIMENTS (1) First Embodiment

A semiconductor memory according to the first embodiment is described with reference to FIG. 1 to FIG. 15.

(a) Configuration

The overall configuration of the semiconductor memory according to the first embodiment is described with reference to FIG. 1.

For example, the semiconductor memory according to the present embodiment is a flash memory. FIG. 1 is a schematic diagram illustrating the configuration of the flash memory in the vicinity of a memory cell array 2.

As shown in FIG. 1, the flash memory includes, in one chip (semiconductor substrate) 10, the memory cell array 2, a row control circuit 3, a column control circuit 4, and a source line driver 5.

The memory cell array 2 includes memory cells MC that are each capable of holding data. The memory cell MC is a field effect transistor which includes a charge storage layer capable of holding a charge, and a control gate electrode.

The flash memory according to the present embodiment is, for example, a NAND-type flash memory. The memory cell array 2 shown in FIG. 1 includes a array of memory cell units MU. Each of the memory cell units MU is formed of memory cells MC and two select transistors ST.

The number of the memory cells MC in one memory cell unit MU may be any number equal to or more than two, and may be, for example, 8, 16, 32, 64, 128, or 256.

In one memory cell unit MU, the current paths of the memory cells MC are connected in series. Hereinafter, a configuration that includes the memory cells having their current paths connected in series is referred to as a NAND string (memory string).

The NAND string is disposed between the select transistors ST1 and ST2. One end of the NAND string is connected to one end of the current path of the select transistor. ST1. The other end of the NAND string is connected to one end of the current path of the select transistor ST2.

The control gate electrode of the memory cell MC is connected to a word line WL. The control gate electrodes of the memory cells MC arranged to the same row are connected to the common word line WL.

The gates of the select transistors ST1 and ST2 arranged in the same row are connected to the same select gate lines SGDL and SGSL, respectively.

The other end (drain) of the current path of the select transistor ST1 is connected to one bit line BL. The memory cell units MU arranged in the same column are connected to the common bit line BL.

The other end (source) of the current path of the select transistor ST2 is connected to a source line SL. The memory cell units MU arranged in the same row are connected to the common source line SL.

The row control circuit 3 selects a row of the memory cell array 2 in accordance with an externally input address. The row control circuit 3 includes a row decoder 31 and a word line driver 33.

The row decoder 31 decodes an external row address signal, and transfers the decoded signal to the word line driver 33.

The word line driver 33 includes transfer gate transistors TGD and TGS and field effect transistors HT having their gates connected to the same transfer gate line TGL.

The two transfer gate transistors TGD and TGS are connected to the common transfer gate line TGL. One end of the current path of one transfer gate transistor TGD is connected to the drain-side select gate line SGDL of the memory cell unit MU. One end of the current path of the other transfer gate transistor TGS is connected to the source-side select gate line SGSL of the memory cell unit MU.

The same number of the field effect transistors HT as the word lines WL connected to the memory cell units MU are connected to the common transfer gate line TGL. The gate of the field effect transistor HT is connected to the transfer gate line TGL. One end of the current path of the field effect transistor HT is connected to the word lines WL. In the word line driver 33, a high breakdown voltage transistor is used for the field effect transistor HT connected to the word line in order to apply a voltage of about 10 V to 25 V to the word line WL. A predetermined voltage such as a program voltage is applied to each of the word lines WL via the channel of the high breakdown voltage transistor.

For example, the voltage applied to the word lines WL is generated by a charge pump circuit.

The column control circuit 4 includes a column decoder 41 and a sense amplifier 43.

The column decoder 41 decodes an external column address signal, and transfers the decoded signal to the sense amplifier 43.

During data reading, the sense amplifier 43 detects and amplifies a potential variation in the bit line dependent on data stored by the memory cell targeted for reading. During data writing, the sense amplifier 43 transfers a predetermined potential to the bit line. The sense amplifier 43 includes, for example, field effect transistors. The field effect transistors included in the sense amplifier 43 mainly are formed by low breakdown voltage transistors. The threshold voltage of a low breakdown voltage transistor LT is lower than the threshold voltage of the high breakdown voltage transistor HT. For example, the sense amplifier 43 has a latch for temporarily holding data.

The source line driver 5 controls the potential level of the source line SL in accordance with the operation of the memory cell array.

The operations of the memory cell array 2, the row/column control circuits 3 and 4, and the source line driver 5 are controlled by a state machine (not shown). The state machine manages and controls the operations of the memory cell array 2 and the circuits 3, 4, and 5 in the chip 10 in accordance with a request from an external device such as a host or a memory controller.

In the present embodiment, circuits other than the memory cell array 2 included in the flash memory, such as the row control circuit 3, the column control circuit 4, and the source line driver 5, are referred to as peripheral circuits. A region where the peripheral circuits are formed in the chip (semiconductor substrate) of the flash memory is referred to as a peripheral circuit region. The low breakdown voltage transistor and the high breakdown voltage transistor that form the peripheral circuits, when not distinguished from each other, are referred to as a peripheral transistor.

The memory cell array 2 and the peripheral circuits 3, 4, and 5 are provided in the common semiconductor substrate (semiconductor chip) 10. Constituent elements in the memory cell array 2 and constituent elements in the peripheral circuits 3, 4, and 5 are formed substantially simultaneously by a common manufacturing process.

The structure of the flash memory according to the present embodiment is described with reference to FIG. 2 to FIG. 5.

FIG. 2 is a plan view illustrating the components included in the flash memory according to the present embodiment. (a) of FIG. 2 shows the planar layout of the memory cell array 2. (b) of FIG. 2 shows the planar layout of the low breakdown voltage transistor LT in the peripheral circuit region. (c) of FIG. 2 shows the planar layout of the high breakdown voltage transistor HT in the peripheral circuit region.

FIG. 3 is a sectional view of the memory cell array 2 and the memory cell MC. (a) of FIG. 3 shows the sectional structure along the line IIIA-IIIA in (a) of FIG. 2. (b) of FIG. 3 shows the sectional structure along the line IIIB-IIIB in (a) of FIG. 2.

FIG. 4 is a sectional view of the low breakdown voltage transistor LT in the peripheral circuit region. (a) of FIG. 4 shows the sectional structure along the line IVA-IVA in (b) of FIG. 2. (b) of FIG. 4 shows the sectional structure along the line IVB-IVB in (b) of FIG. 2.

FIG. 5 is a sectional view of the high breakdown voltage transistor HT in the peripheral circuit region. (a) of FIG. 5 shows the sectional structure along the line VA-VA in (c) of FIG. 2. (b) of FIG. 5 shows the sectional structure along the line VB-VB in (c) of FIG. 2.

Hereinafter, a region LA where the low breakdown voltage transistor is formed in the peripheral circuit region is referred to as a low breakdown voltage transistor formation region LA, and a region HA where the high breakdown voltage transistor is formed is referred to as a high breakdown voltage transistor formation region HA. These formation regions LA and HA, when not distinguished from each other, are referred to as a peripheral transistor formation region.

The structures of the memory cell array 2, the memory cell MC, and the select transistor ST are described with reference to FIG. 2 and FIG. 3.

As shown in (a) of FIG. 2, (a) of FIG. 3, and (b) of FIG. 3, isolation regions STI and active regions AA are provided in the memory cell array 2. In the memory cell array 2, the active regions AA extend in the channel length direction (column direction, y-direction) of the transistor. The isolation region STI is provided between the active regions AA adjacent in the channel width direction (row direction, x-direction) of the transistor. A line-and-space layout is formed in the semiconductor substrate 10 of the memory cell array 2 by the active regions AA extending in the channel length direction and the isolation regions STI extending in the channel length direction.

A p-type well region 12 is provided in the surface layer of the semiconductor substrate 10 of the memory cell array 2. The memory cell MC and the select transistor ST are provided in the active region AA in the p-type well region 12.

As described above, the memory cell MC is a field effect transistor which includes a charge storage layer and a control gate electrode. A charge storage layer 21 is provided on a gate insulating film 20 on the surface of the p-type well region 12. The gate insulating film 20 functions as a tunnel insulating film of the memory cell MC during data writing. The gate insulating film 20 is made of a single layer film or a multilayer film including at least one of a silicon oxide film, a silicon oxynitride film, and a high dielectric constant insulating film (high-k film).

The charge storage layer 21 is provided on the gate insulating film (tunnel insulating film) 20. The charge storage layer 21 is made of, for example, a polysilicon layer or a charge trap insulating film. Hereinafter, the charge storage layer 21 made of the polysilicon layer is referred to as a floating gate electrode 21.

The floating gate electrodes 21 in the memory cells MC adjacent in the channel width direction are electrically isolated by an isolation insulator 19 embedded in the isolation regions STI. In the memory cell array 2, the upper surface of the isolation insulator 19 is set back closer to the bottom of the semiconductor substrate 10 than the upper surface of the floating gate electrode 21 in a direction perpendicular to the surface of the semiconductor substrate 10. As a result, the floating gate electrode 21 is structured so that a part of its upper side surface does not contact the isolation insulator 19. The upper surface of the isolation insulator 19 is substantially flat.

An intergate insulating film 22 is provided on the floating gate electrode 21. The intergate insulating film 22 is made of, for example, a silicon oxide film, a silicon oxynitride film, a stack structure (e.g., ONO film) including a silicon oxide film and a silicon nitride film, or a high dielectric constant insulating film. The intergate insulating film 22 may be a single layer film that uses the above-mentioned films, or may be a multilayer film.

A control gate electrode 23 is stacked on the floating gate electrode 21 via the intergate insulating film 22. The control gate electrode 23 faces the upper surface of the floating gate electrode 21 and also faces the side surface of the floating gate electrode 21 in the channel width direction. The control gate electrode 23 not only covers the upper surface of the floating gate electrode 21 but also covers the side surface of the floating gate electrode 21 such that the coupling ratio between the control gate electrode 23 and the floating gate electrode 21 of the memory cell MC is improved. In the isolation region, the control gate electrode 23 is provided on the isolation insulator 19 via the intergate insulating film 22.

The control gate electrode 23 extends, for example, in the channel width direction, and is shared by the memory cells MC arranged in the channel width direction. The control gate electrode 23 functions as the word line WL.

For example, the control gate electrode 23 may have a single layer structure of a conductive polysilicon layer, a single layer structure of a silicide layer, or a stack structure (polycide structure) of a polysilicon layer and a silicide layer. The control gate electrode 23 may otherwise have a single layer structure of a metal layer, or a multilayer structure including a metal layer.

The memory cells MC in the common active region AA adjacent to each other in the channel length direction share the source/drain so that their current paths are connected in series. As a result, the NAND string including the memory cells is formed. For example, a diffusion layer (source/drain diffusion layer) 26 as the source/drain of the memory cell MC is formed in the p-type well region 12. The diffusion layer 26 is, for example, an n-type impurity semiconductor layer. A region between the adjacent source and drain is a channel region serving as an electron moving region. However, the source/drain diffusion layer 26 may not be formed in the memory cell MC.

The memory cell MC may have a gate structure having a MONOS structure. In this case, the charge storage layer 21 is made of an insulating film such as a silicon nitride film that includes an electron trap level. The insulator 22 is referred to as a block insulating film.

The select transistors ST1 and ST2 are provided on one end of the active region AA corresponding to the memory cell unit MU and the other. The two select transistors ST in the memory cell unit MU have substantially the same gate structure. Therefore, in FIG. 2 and FIG. 3, the select transistor ST1 on the drain side of the NAND string is only shown, and the select transistor on the source side of the NAND string is not shown. Hereinafter, the select transistors ST1 and ST2 on the drain side and the source side, when not distinguished from each other, are referred to as a select transistor ST.

The select transistor ST is formed substantially simultaneously with the memory cell MC.

A gate insulating film 20A of the select transistor ST is provided on the surface of the well region 12. The gate insulating film 20A is formed substantially simultaneously with the tunnel insulating film 20 of the memory cell MC. In this case, the gate insulating film 20A is made of the same material as the tunnel insulating film 20, and has the same thickness as the tunnel insulating film 20.

The gate electrode of the select transistor ST has a stack gate structure including a lower electrode 21A and an upper electrode layer 23A.

The lower electrode layer 21A of the select transistor ST is provided on the gate insulating film 20A. The lower electrode layer 21A is formed substantially simultaneously with the floating gate electrode 21. Therefore, the lower electrode layer 21A is made of the same material (polysilicon) as the floating gate electrode 21, and has the same thickness as the floating gate electrode 21.

An insulator 22A having an opening OP is provided on the lower electrode layer 21A. The insulator 22A is made of the same material as the intergate insulating film 22, and has substantially the same thickness as the intergate insulating film 22. Hereinafter, a process for forming the opening OP in the insulator (intergate insulating film) 22A between the stacked electrode layers of the select transistor ST is referred to as an EI process. A region in which the opening OP formed by the EI process is provided is referred to as an EI region.

For example, the lower electrode layer 21A is etched by the EI process to correspond to the formation position of the opening OP so that the upper surface of the lower electrode layer 21A is depressed. In this case, the sectional shape of the lower electrode layer 21A is hollow.

The upper electrode layer 23A of the select transistor. ST is provided on the insulator 22A, and stacked on the lower electrode layer 21A across the insulator 22A. The upper electrode layer 23A is electrically connected to the lower electrode layer 21A via the opening OP of the insulator 22A.

The upper electrode layer 23A is formed substantially simultaneously with the control gate electrode 23. The upper electrode layer 23A is made of the same material as the control gate electrode 23, and has substantially the same thickness as the control gate electrode 23.

The upper electrode layer 23A of the select transistor ST extends in the channel width direction, and is shared by the select transistors arranged in the channel width direction. The upper electrode layer 23A functions as the select gate line.

In the well region 12, diffusion layers 26A as the source/drain of the select transistor ST are provided. One of the two diffusion layers 26A of the select transistor ST is shared by the source/drain of the memory cell MC at the end of the NAND string. Thus, the select transistor ST is connected in series to the current path of the NAND string, so that the memory cell unit is formed. The other of the two diffusion layers 26A of each select transistor ST is connected to a contact plug CP. Via this contact plug CP1, one end of the memory cell unit MU is connected to the bit line BL, and the other end of the memory cell unit MU is connected to the source line SL.

Interlayer insulating films 80 and 81 are provided on the semiconductor substrate 10 to cover the memory cell MC and the select transistor ST. The interlayer insulating films 80 and 81 are, for example, silicon oxide films.

The contact plug CP1 is formed in a contact hole which is formed in the interlayer insulating film 80. The contact plug CP1 contacts the upper surface of the source/drain diffusion layer 26A of the select transistor ST.

A metal layer M0 is provided on the interlayer insulating film 80 and the contact plug CP1. The metal layer M0 is electrically connected to the contact plug CP1.

When the contact plug CP1 is connected to the select transistor ST on the drain side of the memory cell unit MU, a via plug VP is connected to the metal layer M0. The via plug VP fills the contact hole in the interlayer insulating film 81. The bit line BL extending in the channel length direction is provided on the interlayer insulating film 81 and on the via plug VP. The bit line BL is connected to the drain-side select transistor ST1 via the via plug VP, the metal layer (intermediate metal layer) M0, and the contact plug CP.

On the source side of the memory cell unit MU, the source-side select transistor (not shown) is connected to a contact plug (not shown) filling the interlayer insulating film 80, and this contact plug is connected to a metal layer on the same interconnect level as the intermediate metal layer M0. This metal layer functions as the source line, and extends in the channel width direction.

In the present embodiment, the interconnect level indicates the position (height) based on the surface of the semiconductor substrate in a direction perpendicular to the surface of the substrate.

In two memory cell units arranged in the channel length direction, the memory cell units MU are formed on the active region AA so that the two drain-side select transistors ST1 face each other across the contact plug CP1 in the channel length direction. The two drain-side select transistors ST1 share the plugs CP1 and VP, and the metal layers M0 and M1.

The two source-side select transistors ST2 facing each other across the contact plug in the channel length direction also share the plugs and the metal layers.

The gate structure of the select transistor ST is different from the gate structure of the memory cell MC in that the upper electrode layer 23A contacts the lower electrode layer 21A through the opening OP formed in the insulator 22A. Thus, in the select transistor ST, the upper electrode layer 23A is electrically connected to the lower electrode layer 21A.

For example, the channel length of the select transistor ST is larger than the channel length of the memory cell MC.

The structure of the peripheral transistor is described with reference to FIG. 2, FIG. 4, and FIG. 5. As described above, the peripheral circuit includes the low breakdown voltage transistor LT and the high breakdown voltage transistor HT as the peripheral transistors. The peripheral transistor may be an enhancement type or may be a depression type. For example, in the enhancement-type peripheral transistor, the low breakdown voltage transistor LT is driven by a threshold voltage having an absolute value of about 0V to 7V, and the high breakdown voltage transistor HT is driven by a threshold voltage having an absolute value of about 10V to 30V.

Each of the peripheral transistors LT and HT has a gate structure similar to that of the select transistor ST.

As shown in (b) of FIG. 2, (a) of FIG. 4, and (b) of FIG. 4, the low breakdown voltage transistor LT is provided in an active region AAL surrounded by an isolation region STIL. The active region AAL having a quadrangular planar shape is surrounded by the isolation region STIL.

As shown in (c) of FIG. 2, (a) of FIG. 5, and (b) of FIG. 5, the high breakdown voltage transistor HT is provided in an active region AAH surrounded by an isolation region STIH. The active region AAH having a quadrangular planar shape is surrounded by the isolation region STIH.

A well region 12L is provided in the active region AAL in which the low breakdown voltage transistor LT is provided. The conductivity type of the well region 12L is set to one of a p-type and an n-type depending on whether the low breakdown voltage transistor LT is an n-channel type or a p-channel type.

For example, no well region is provided in the active region AAH in which the high breakdown voltage transistor HT is provided. The active region AAH is an intrinsic region including almost no impurity that gives conductivity. A well region having an impurity concentration lower than the impurity concentrations of the well regions 12 and 12L in the memory cell array 2 and the low breakdown voltage transistor formation region LA may be provided in the active region AAH of the high breakdown voltage transistor HT.

Gate insulating films 20L and 20H of the low breakdown voltage and high breakdown voltage transistors LT and HT are provided on the surfaces of the active regions (well regions) AAL and AAH.

The gate insulating film 20L of the low breakdown voltage transistor LT is formed substantially simultaneously with, for example, the gate insulating films 20 and 20A of the memory cell MC and the select transistor ST. In this case, the gate insulating film 20L of the low breakdown voltage transistor LT is made of the same material as the gate insulating films 20 and 20A of the memory cell MC and the select transistor ST, and has the same thickness as the gate insulating films 20 and 20A.

The gate insulating film 20H of the high breakdown voltage transistor HT is thicker (larger) in thickness than the gate insulating films 20, 20A, and 20L of the memory cell MC, the select transistor ST, and the low breakdown voltage transistor LT. Thus, the high breakdown voltage transistor HT ensures a higher breakdown voltage than the other transistors MC, ST, and LT. The gate insulating film 20H of the high breakdown voltage transistor HT is formed in a process different from those of the gate insulating films 20, 20A, and 20L of the memory cell MC, the select transistor ST, and the low breakdown voltage transistor LT. The gate insulating film 20H of the high breakdown voltage transistor HT may be made of a material different from those of the gate insulating films 20, 20A, and 20L of the other transistors MC, ST, and LT.

The gate insulating film 20L of the low breakdown voltage transistor LT may be thicker (larger) in thickness than the gate insulating films 20 and 20A of the memory cell MC and the select transistor ST. When the gate insulating film 20L of the low breakdown voltage transistor LT is thicker in thickness than the gate insulating film 20 of the memory cell MC, the gate insulating film 20L of the low breakdown voltage transistor LT is formed in a process different from that of the gate insulating film 20 of the memory cell MC. The material of the gate insulating film 20L of the low breakdown voltage transistor LT may be different from the materials of the gate insulating films 20 and 20A of the memory cell MC and the select transistor ST.

For example, the thickness of the gate insulating film 20L of the low breakdown voltage transistor LT is set at about 5 nm to 10 nm, and the thickness of the gate insulating film 20H of the high breakdown voltage transistor HT is set at about 30 nm to 100 nm.

Gate electrodes LG and HG of the low breakdown voltage and high breakdown voltage transistors LT and HT are provided on the gate insulating films 20L and 20H, respectively. The gate electrodes LG and HG of the low breakdown voltage and high breakdown voltage transistors LT and HT have gate structures in which lower electrode layers 21L and 21H and upper electrode layers 23L and 23H are stacked via insulators 22L and 22H having the openings OP, in the same manner as the select transistor ST.

The lower electrode layers 21L and 21H of the gate electrodes LG and HG of the low breakdown voltage and high breakdown voltage transistors LT and HT are provided on the gate insulating films 20L and 20H, respectively. The lower electrode layers 21L and 21H have the same configuration (thickness and material) as the charge storage layer 21 of the memory cell MC. When the memory cell MC uses a floating gate electrode as the charge storage layer 21, polysilicon layers are used for the lower electrode layers 21L and 21H. For example, in the gate electrodes LG and HG of the low breakdown voltage and high breakdown voltage transistors LT and HT, the side surface of the lower electrode layer 21H in the channel width direction is in contact with the side surfaces of isolation insulators 19X and 19Z.

The insulators 22L and 22H having the openings OP are provided on the lower electrode layers 21L and 21H of the low breakdown voltage and high breakdown voltage transistors LT and HT. For the insulators 22L and 22H, films having the same configuration (thickness and material) as the insulator (intergate insulating film, block insulating film) 22 of the memory cell MC are used. The openings OP of the insulators 22L and 22H are formed by the EI process.

The upper electrode layers 23L and 23H of the gate electrodes LG and HG of the low breakdown voltage and high breakdown voltage transistors LT and HT are stacked on the lower electrode layers 21L and 21H via the insulators 22L and 22H. The upper electrode layers 23L and 23H are partly connected to the lower electrode layers 21L and 21H through the openings OP. The upper electrode layers 23L and 23H have the same configuration (thickness and material) as the control gate electrode 23 of the memory cell MC. The upper electrode layers 23L and 23H may have a single layer structure of a semiconductor layer (e.g., conductive polysilicon layer), a single layer structure of a conductive layer (e.g., silicide layer or metal layer), or a stack structure of a semiconductor layer and a conductive layer.

In the configuration shown according to the present embodiment, the upper electrode layers 23L and 23H are connected to the lower electrode layers 21L and 21H via the openings of the insulators 22L and 22H in the gate electrodes LG and HG of the peripheral transistors LT and HT. However, the peripheral transistors LT and HT may be formed so that the upper electrode layers 23L and 23H and the lower electrode layers 21L and 21H are not divided by the insulators 22L and 22H. The gate electrodes LG and HG of the peripheral transistors LT and HT may be formed by one continuous layer. In this case, the gate electrodes LG and HG of the peripheral transistors LT and HT do not include the insulators made of the same material as the intergate insulating film 22. In the gate electrodes LG and HG of the peripheral transistors LT and HT, the insulators 22L and 22H between the upper electrode layers 23L and 23H and the lower electrode layers 21L and 21H do not need to have the openings.

As shown in FIG. 2, FIG. 4, and FIG. 5, the upper electrode layers 23L and 23H of the low breakdown voltage and high breakdown voltage transistors LT and HT are led into the isolation region STIH from the active region AAH in the channel width direction of the transistors. The parts of the upper electrode layers 23L and 23H led into the isolation region STIH are located above the isolation insulators 19X and 19Z via the insulators 22L and 22H. The parts of the upper electrode layers 23L and 23H above the isolation insulators 19X and 19Z are referred to as gate fringe portions. The gate fringe portions are provided on the isolation insulators 19X and 19Z in the channel width direction of the transistors LT and HT. The gate fringe portions and the gate electrodes LG and HG of the transistors are continuous as one conductor. The gate fringe portions are electrically connected to the gate electrode HG.

The high breakdown voltage transistor HT has a gate length (channel length) and a gate width (channel width) that are larger than those of the select transistor ST and the low breakdown voltage transistor LT in order to ensure a high breakdown voltage and to transfer, to the word line WL, such a high voltage (e.g., 25 V) as a write voltage.

Diffusion layers 26L and 26H are provided in the active regions AAL and AAH as the sources and drains of the low breakdown voltage and high breakdown voltage transistors LT and HT, respectively. The conductivity type of the diffusion layer 26L is properly set depending on whether the low breakdown voltage and high breakdown voltage transistors LT and HT are an re-channel type or a p-channel type.

Contact plugs CPP1L and CPP1H are connected to the diffusion layers 26L and 26H, respectively. The contact plugs CPP1L and CPP1H fill the contact holes formed in the interlayer insulating film 80. Interconnects MP1L and MP1H are provided on the contact plugs CPP1L and CPP1H and the interlayer insulating film 80. The interconnects MP1L and MP1H are located on the same interconnect level as the intermediate interconnect (intermediate wiring line) M0 in the memory cell array 2. Each of the interconnects MP1L and MP1H is connected to a interconnect (not shown) provided on a higher interconnect level via a via plug (not shown) to form a predetermined circuit.

Contact plugs CPP2L and CPP2H are connected to the gate electrodes LG and HG of the low breakdown voltage and high breakdown voltage transistors LT and HT, respectively. interconnects MP2L and MP2H are connected to the contact plugs CPP1L and CPP1H.

Isolation trenches having an STI structure are formed in the isolation regions STIL and STIH. The isolation insulators 19X and 19Z are provided in the trenches. The same material as that of the isolation insulator 19 in the memory cell array 2 is used for the isolation insulators 19X and 19Z. For example, a high-viscosity material is used for the isolation insulators 19, 19X, and 19Z.

In the flash memory according to the present embodiment, the isolation region STIL of each of the peripheral transistor formation regions LA and HA includes two regions.

As shown in (b) of FIG. 2 and FIG. 4, the isolation region STIL of the low breakdown voltage transistor formation region LA is provided between two active regions AAL. The isolation region STIL electrically isolates the two active regions AAL. The isolation region STIL includes a first region SS1 and a second region SS2.

The first region SS1 is provided in the center of the isolation region STIL. The second region SS2 is adjacent to the active region AAL. The second region SS2 is provided between the first region SS1 and the active region AAL. In the isolation region STIL, the first region SS1 intervenes between two second regions SS2 in a direction that intersects with the extending direction of the isolation region STIL.

In the first and second regions SS1 and SS2 in the isolation region STIL, insulating films (also referred to as isolation films) 190 and 195 are provided as the isolation insulator 19X. The same material is used for the insulating films 190 and 195 in the first and second regions SS1 and SS2. For example, an insulator such as polysilazane formed by a coating method is used as the material of the isolation films 190 and 195. However, other insulators such as a TEOS film may be used for the isolation films 190 and 195 and the isolation insulator.

For example, in the direction perpendicular to the surface of the semiconductor substrate 10 (film stacking direction), the upper surface (top) of the first isolation film (first film) 190 in the first region SS1 is set back closer to the bottom of the semiconductor substrate 10 (to the bottom of the isolation insulator 19X) than the upper surface of the second isolation film (second film) 195 in the second region SS2. In the direction perpendicular to the surface of the semiconductor substrate 10, the height of the upper surface of the first isolation film 190 is lower than the height of the upper surface of the second isolation film 195 when the surface of the semiconductor substrate 10 is used as the standard for height. The difference of height between the upper surfaces of the isolation films 190 and 195 results in a step in the upper surface of the isolation insulator 19X.

For example, the upper surface of the first isolation film (also referred to as a center) 190 falls (tilts) in stages toward the bottom of the semiconductor substrate 10 from the border between the first region SS1 and the second region SS2 to the center of the first region SS1.

The top of the first isolation film 190 is located closer to the bottom of the semiconductor substrate 10 than the bottom of the gate fringe portion. The top of the first isolation film 190 is located closer to the bottom of the semiconductor substrate 10 than the top of the lower electrode layer 21L.

The upper surface of the first isolation film 190 is set back to the bottom of the semiconductor substrate 10 such that a recess (valley) RC1 is formed in the top of the isolation insulator 19X of the low breakdown voltage transistor LT. The depth of the recess RC1 gently changes from the border between the first region SS1 and the second region SS2 to the center of the first region, and is largest in the vicinity of the center of the first region SS1. The bottom of the recess RC1 (the upper surface of the first isolation film 190) is curved, and has a predetermined curvature. The sectional shape of the recess RC1 is semielliptic.

For example, in the direction perpendicular to the surface of the semiconductor substrate 10, the deepest portion of the upper surface of the first isolation film 190 (the deepest portion of the recess RC1) is located at the height between the top and bottom of the lower electrode layer 21L of the transistor LT. In the direction perpendicular to the surface of the semiconductor substrate 10, the deepest portion of the upper surface of the first isolation film 190 (the deepest portion of the recess RC1) may be located closer to the bottom of the semiconductor substrate 10 than the bottom of the lower electrode layer 21L or may be located closer to the bottom of the semiconductor substrate 10 than the bottom of the gate insulating film 20L of the transistor. LT.

In the direction perpendicular to the surface of the semiconductor substrate 10, the position of the bottom of the first isolation film 190 substantially corresponds to the position of the bottom of the second isolation film 195.

The second isolation film 195 in the second region SS2 is adjacent to the side surface of the active region AAL.

The height of the upper surface of the second isolation film (also referred to as an adjacent portion) 195 is fixed, for example, in a direction parallel to the surface of the semiconductor substrate 10. In the direction perpendicular to the substrate surface, the height of the upper surface of the second isolation film 195 is set to the same position as the top of the lower electrode layer 21L. The second isolation film 195 covers the side surface of the active region AAL and the side surface of the channel region in the channel width direction. The second isolation film 195 also covers the side surface of the lower electrode layer 21L in the channel width direction.

The gate fringe portion is provided on the upper surface of the second isolation film 195. A part (part that is not covered with the gate fringe portion) of the upper surface of the second isolation film 195 is in contact with the interlayer insulating film 80.

However, depending on the etching during the process of manufacturing the flash memory, the upper surface of the second isolation film 195 may also be set back to the bottom of the semiconductor substrate 10 in such a manner as to self-align with the gate fringe portion, and a recess may be formed in the upper surface of the second isolation film 195 that is in contact with the active region AAL. In this case, the depth of the recess in the top of the second isolation film 195 is smaller than the depth of the recess RC1 in the top of the first isolation film 190.

The thickness (average value) of the first isolation film 190 is thinner (smaller) than the thickness of the second isolation film 195. For example, the width W1 of the first isolation film 190 is larger than the width (maximum width) W2 of the second isolation film 195.

In the present embodiment, the border between the first region SS1 and the second region SS2 is the portion in which the fall of the upper surface of the first isolation film 190 in the center of the isolation insulator 19X starts.

For example, components of the gate electrode LG of the transistor LT are provided in the recess RC1 of the first isolation film 190. In the example shown in FIG. 4, an insulator 22D and a conductor 23D are provided in the recess RC1 in the first isolation film 190. The insulator 22D in the recess RC1 includes the same material as that of the intergate insulating film 22 of the memory cell MC. The conductor 23D in the recess RC1 includes the same material as that of the control gate electrode 23 of the memory cell MC. The conductor 23D in the recess RC1 is electrically isolated from the gate electrode LG of the transistor LT. The insulator 22D and the conductor 23D are referred to as dummy layers. The dummy layers 22D and 23D have no functions that contribute to the operation of the flash memory. The dummy layers 22D and 23D do not have to be provided on the first isolation film 190. When the dummy layers 22D and 23D are not provided on the first isolation film 190, the interlayer insulating film 80 is provided on the first isolation film 190. For example, the recess RC1 of the isolation insulator 19X is filled with the interlayer insulating film 80, and the upper surface of the first isolation film 190 contacts the interlayer insulating film 80.

For example, the isolation insulator 19Z is provided in the isolation region STIR in the high breakdown voltage transistor formation region HA. The isolation insulator 19Z has no recess, and the upper surface of the isolation insulator 19Z is flat. For example, the upper surface of the isolation insulator 19Z is in contact with the interlayer insulating film 80.

In the direction perpendicular to the surface of the semiconductor substrate 10, the position of the upper surface of the second isolation film 195 substantially corresponds to the position of the upper surface of the isolation insulator 19Z in the high breakdown voltage transistor formation region HA.

In the memory cell array 2, in the low breakdown voltage transistor formation region LA, and in the high breakdown voltage transistor formation region HA, the bottoms of the isolation insulators 19, 19X (190 and 195), and 19Z (the bottoms of the isolation trenches) in the direction perpendicular to the surface of the semiconductor substrate are set at substantially the same position (height).

As described above, in the flash memory according to the present embodiment, the active region is defined in the peripheral transistor formation region (here, the low breakdown voltage transistor formation region) in the same semiconductor substrate as the memory cell array 2 by the isolation region STIL that includes the two regions SS1 and SS2. The isolation insulator 19X of the isolation region STIL includes the insulating films (isolation films) 190 and 195 different in upper surface position (height).

The upper surface of the first isolation film 190 in the center (first region) SS1 of the isolation region STIL includes a part located closer to the bottom of the semiconductor substrate 10 than the upper surface of the second isolation film 195 provided in the second region SS2 between the first isolation film 190 of the center SS1 and the active region AAL.

When the surface of the semiconductor substrate 10 is used as the standard for height, at least a part of the upper surface of the first isolation film 190 in the center of the isolation region STIL is located lower than the upper surface of the second isolation film 195 adjacent to the active region AAL.

The positions of the bottoms of the first and second isolation films 190 and 195 substantially correspond to each other, and for example, the bottom of the isolation insulator 19X is flat. The thickness of the first isolation film 190 of the central region SS1 of the isolation region STIL is thinner (smaller) than the thickness of the isolation film 195 adjacent to the active region AAL.

The application of the stress of the isolation insulator to the active region may produce crystal defects in the active region. The crystal defects are produced depending on the total amount (volume) and thickness of the filling material (isolation insulator) that fills the space between the active regions.

In the flash memory according to the present embodiment, the insulator as the isolation insulator is provided in the isolation trench so that the upper surface of the isolation insulator 19X in the isolation region STI is partly set back to the bottom of the semiconductor substrate 10. Thus, in the flash memory according to the present embodiment, the volume of the isolation insulator in the isolation region STIL can be smaller than when the insulator fills the isolation trench so that the upper surface of the isolation insulator is flat in the isolation region STIL.

As a result, in the peripheral transistor formation region LA, the stress (compressive stress) applied to the active region AAL from the isolation insulator 19X is reduced. Therefore, in the flash memory according to the present embodiment, the production of crystal defects in the active region (semiconductor region) AAL resulting from the stress from the isolation insulator is inhibited.

Consequently, in the flash memory according to the present embodiment, the deterioration of element characteristics resulting from crystal defects such as a junction leakage of a field effect transistor can be reduced.

Furthermore, in contrast with the first isolation film 190 in the center of the isolation region STIL, the upper surface of the isolation film 195 adjacent to the active region AAL is not set back to the bottom of the semiconductor substrate 10. The position of the top (upper surface) of the second isolation film 195 substantially corresponds to, for example, the position of the top of the lower electrode layer 21L.

Thus, in the isolation insulator 19X, the height of the upper surface of the isolation film 195 adjacent to the active region AAL is not set back to the semiconductor substrate 10. It is thereby possible to prevent the suction and penetration of impurity ions generated during the process (e.g., post-process) of manufacturing the channel region and the source/drain regions. As a result, in the flash memory according to the present embodiment, the characteristic deterioration of the transistor can be inhibited.

As will be described later, in the peripheral transistor formation regions LA and HA, a common process is used to set back the upper surface of the center (the first isolation film 190) of the isolation insulator 19X to the bottom of the semiconductor substrate 10 (the process for forming the recess RC1 in the isolation insulator 19X) and to fabricate the components of the flash memory. Therefore, the process for manufacturing the flash memory according to the present embodiment requires no additional process to set the position of the upper surface of the first isolation film 190 in the isolation insulator 19X to be lower than the position of the upper surface of the isolation film 195 adjacent to the active region AAL.

Therefore, in the process for manufacturing the flash memory according to the present embodiment, there is no additional process to form the isolation insulator having a step on its upper surface.

The volume of the isolation insulator 19X is reduced as a result of the etching of the isolation insulator 19X in the first region SS1. In this case, the upper surface of the isolation insulator 19X can be etched to follow the form of the isolation region STIL. Thus, the flash memory according to the present embodiment allows the volume of the isolation insulator 19X to be reduced by the relatively easy layout and manufacturing process.

Furthermore, in the flash memory according to the present embodiment, the volume of the isolation insulator is reduced by the etching of the isolation insulator. Therefore, the reduction of the volume of the isolation insulator can be adjusted by etching. Thus, the flash memory according to the present embodiment allows, at the same time, the reduction of the volume of the isolation insulator to be increased, a breakdown voltage to be ensured by the isolation insulator, and the elements to be electrically isolated.

In the present embodiment described above, the first and second isolation films 190 and 195 different in upper surface height are provided in the isolation region STIL of the low breakdown voltage transistor formation region LA. However, the first and second isolation films 190 and 195 may be provided in the isolation region STIH of the high breakdown voltage transistor formation region HA. Alternatively, the first and second isolation films 190 and 195 may be provided in the isolation regions STIL and STIH in both the low breakdown voltage transistor formation region LA and the high breakdown voltage transistor formation region HA. In these cases, advantageous effects similar to those described above are provided.

As described above, the flash memory according to the first embodiment allows the deterioration of element characteristics resulting from the stress of the isolation film to be reduced. The flash memory according to the first embodiment also allows the deterioration of operational characteristics to be inhibited without addition to the manufacturing process.

(b) Manufacturing Method

A method of manufacturing the semiconductor memory according to the first embodiment is described with reference to FIG. 3 to FIG. 15.

<Manufacturing Method 1>

Manufacturing method 1 of the flash memory according to the present embodiment is described with reference to FIG. 3 to FIG. 13.

Figure 6:
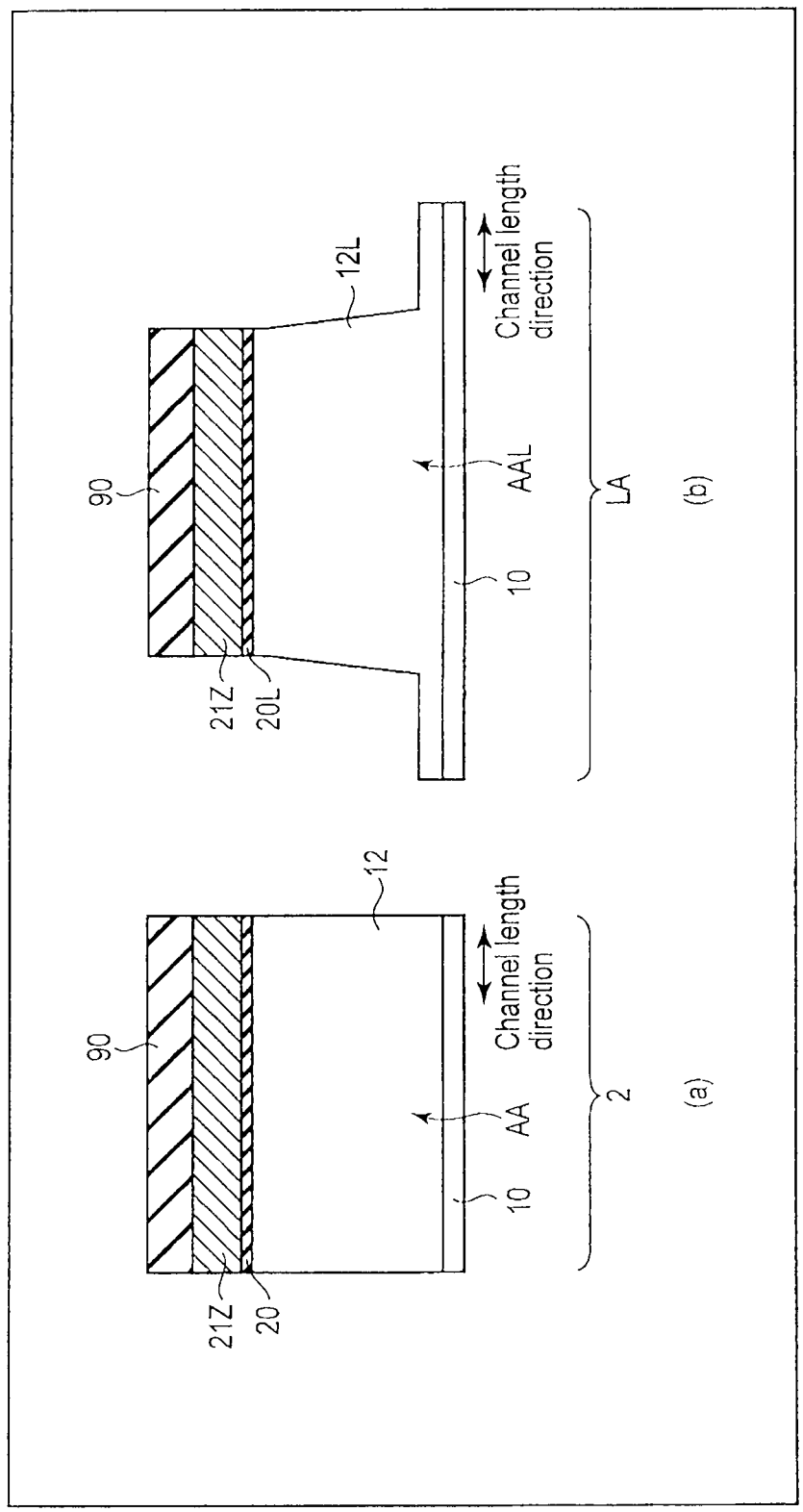
FIG. 6 is a sectional view illustrating a method of manufacturing the semiconductor memory according to the first embodiment.
Figure 7:
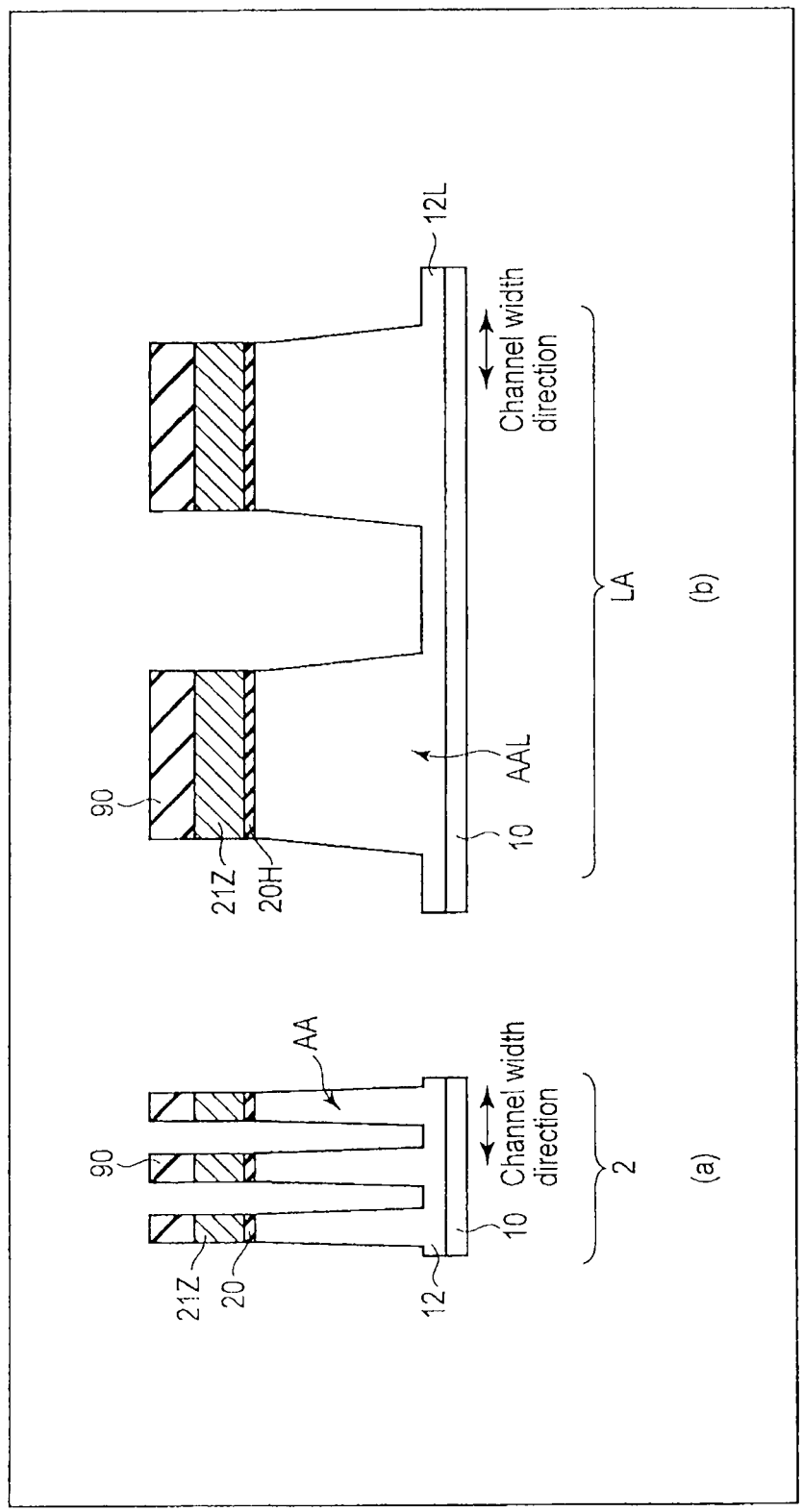
FIG. 7 is a sectional view illustrating the method of manufacturing the semiconductor memory according to the first embodiment.

One process in the manufacturing method of the flash memory according to the present embodiment is described with reference to FIG. 6 and FIG. 7. FIG. 6 is a process sectional view showing the memory cell and the peripheral transistor along the channel length direction. FIG. 7 is a process sectional view showing the memory cell and the peripheral transistor along the channel width direction. (a) of FIG. 6 and (a) of FIG. 7 show process sectional views of the memory cell. (b) of FIG. 6 and (b) of FIG. 7 show process sectional views of the peripheral transistor.

The low breakdown voltage transistor is shown as an example of the peripheral transistor to describe the manufacturing method of the flash memory according to the present embodiment below. However, the manufacturing method described in the present embodiment is not limited to the manufacturing process for the low breakdown voltage transistor included in the flash memory, and may be applied to the manufacturing process for the high breakdown voltage transistor included in the flash memory.

As shown in FIG. 6 and FIG. 7, well regions 12 and 12L having a predetermined impurity concentration are formed in a semiconductor substrate 10 (e.g., silicon substrate), for example, by an ion implantation method in a memory cell array 2 and a low breakdown voltage transistor formation region LA. For example, no well region is formed in a high breakdown voltage transistor formation region, and an intrinsic region containing almost no impurity is provided in the high breakdown voltage transistor formation region. Alternatively, a well region in the high breakdown voltage transistor formation region is formed so that the impurity concentration of the well region in the high breakdown voltage transistor formation region is lower than the impurity concentration of the well region 12 or 12L in the memory cell array 2 or the low breakdown voltage transistor formation region LA.

A silicon oxide film as a gate insulating film of the high breakdown voltage transistor is formed on the surface of the semiconductor substrate 10 in the high breakdown voltage transistor formation region, for example, by a thermal oxidation method. The oxide film formed in the memory cell array 2 and in the low breakdown voltage transistor formation region LA by the thermal oxidation process is removed by a photolithographic technique and a reactive ion etching (RIE) method.

Oxide films 20 and 20L are formed, for example, by a thermal oxidation treatment on the surface of the semiconductor substrate 10 exposed in the memory cell array 2 and the low breakdown voltage transistor formation region LA. The oxide film formed in the memory cell array 2 serves as a gate insulating film (tunnel insulating film) 20 of the memory cell and a gate insulating film 20 of a select transistor ST. The oxide film 20L formed in the low breakdown voltage transistor formation region LA serves as a gate insulating film 20L of the low breakdown voltage transistor In the memory cell array 2 and the low breakdown voltage transistor formation region LA, a polysilicon layer (charge storage layer) 21Z is deposited on the oxide films 20 and 20L, for example, by a chemical vapor deposition (CVD) method. The polysilicon layer 21Z is used as a floating gate electrode of the memory cell, the select transistor ST, and a lower electrode layer of the peripheral transistor.

A silicon nitride film 90 as a hard mask is deposited on the polysilicon layer 21Z, for example, by the CVD method. The silicon nitride film 90 is patterned by a lithographic technique and the reactive ion etching (RIE) method to match the shape of an active region.

Furthermore, in the memory cell array 2 and the low breakdown voltage transistor formation region LA, the silicon nitride film 90 patterned into a predetermined shape is used as a mask to sequentially etch the polysilicon layer 21Z, the oxide films 20 and 20L, and the semiconductor substrate 10, for example, by the RIE method. As a result, a trench (isolation trench) is formed in the semiconductor substrate 10.

A linear active region AA is formed in the memory cell array 2. The active region and the isolation trench extend in the channel, length direction (column direction) of the transistor. A line-and-space layout is formed in the semiconductor substrate 10 in the memory cell array 2 by the active region AA and the isolation trench.

In the peripheral transistor formation region LA, an isolation trench is formed around the active region. Therefore, rectangular active regions AAL and AAH are formed in the peripheral transistor formation region LA. For example, the area of the active region of the low breakdown voltage transistor formation region LA is smaller than the area of the active region of the high breakdown voltage transistor formation region. For example, the width of the isolation trench of the low breakdown voltage transistor formation region LA is smaller than the width of the isolation trench of the high breakdown voltage transistor formation region.

A native oxide film (not shown) or a protective film (not shown) may be formed on the semiconductor substrate (active region) exposed by the isolation trench.

The active region AA of the memory cell array 2 may be fabricated by a sidewall transfer process.

Figure 8:
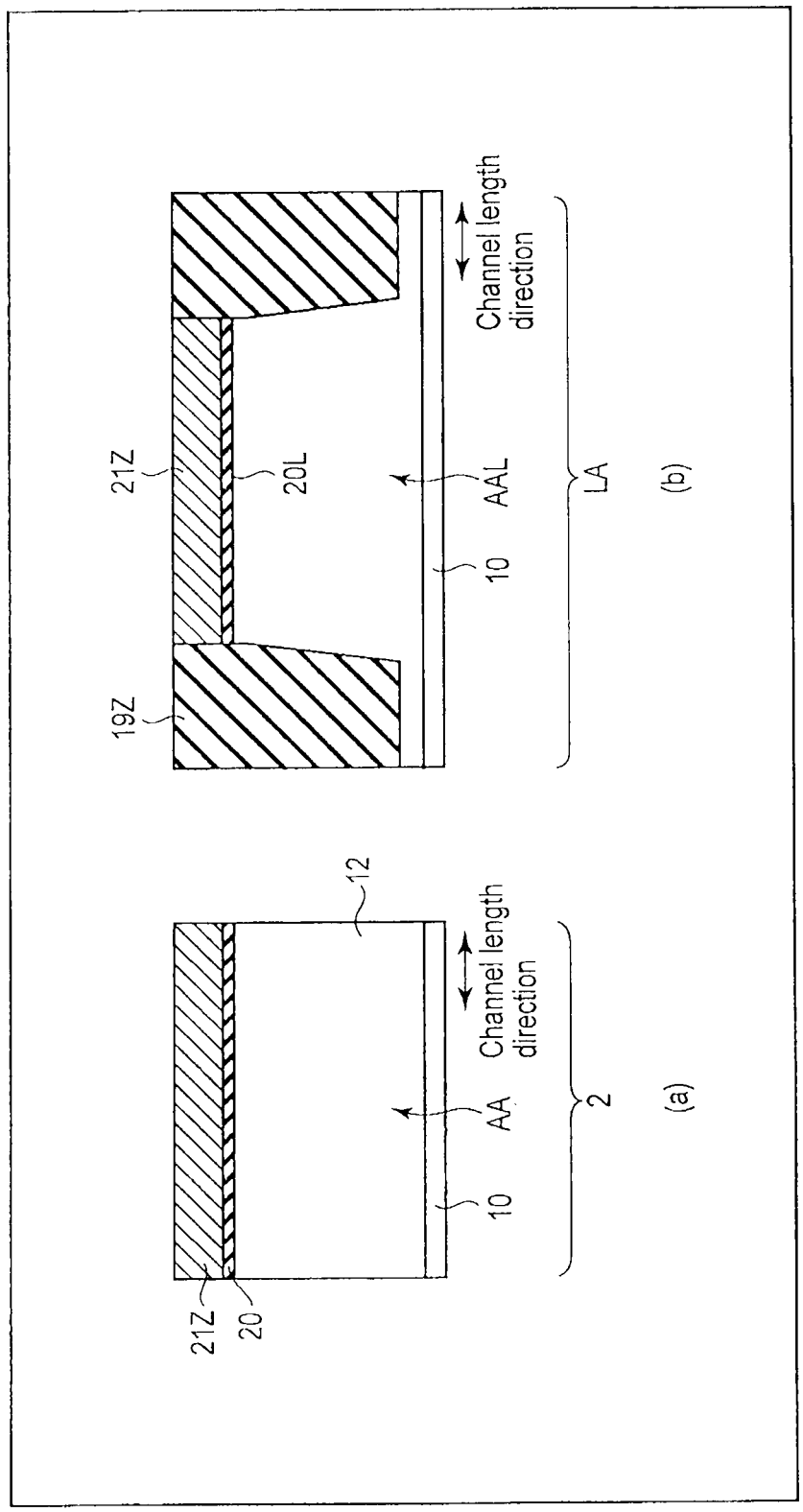
FIG. 8 is a sectional view illustrating the method of manufacturing the semiconductor memory according to the first embodiment.

One process in the manufacturing method of the flash memory according to the present embodiment is described with reference to FIG. 8 and FIG. 9. FIG. 8 is a process sectional view showing the memory cell and the peripheral transistor along the channel length direction. FIG. 9 is a process sectional view showing the memory cell and the peripheral transistor along the channel width direction. (a) of FIG. 8 and (a) of FIG. 9 show process sectional views of the memory cell array 2. (b) of FIG. 8 and (b) of FIG. 9 show process sectional views of the peripheral transistor.

As shown in FIG. 8 and FIG. 9, after the silicon nitride film (hard mask) on the polysilicon layer 21Z is removed, an insulator (e.g., silicon oxide) is formed in the isolation trench and on the polysilicon layer 21Z, for example, by the coating method or CVD method. For example, a high-viscosity material (e.g., polysilazane) is used for the insulator.

The upper surface of the insulator is planarized by etchback or a CMP method using, for example, the upper surface of the polysilicon layer 21Z as a stopper. As a result, an isolation insulator (e.g., silicon oxide) 19Z having an STI structure is formed in the isolation trench in the semiconductor substrate 10. The upper surface of the polysilicon film 21Z is exposed.

For example, the height of the upper surface of the isolation insulator 19Z substantially corresponds to the height of the upper surface of the polysilicon layer 21Z.

One process in the manufacturing method of the flash memory according to the present embodiment is described with reference to FIG. 10 and FIG. 11. FIG. 10 is a process sectional view showing the memory cell and the peripheral transistor along the channel length direction. FIG. 11 is a process sectional view showing the memory cell and the peripheral transistor along the channel width direction. (a) of FIG. 10 and (a) of FIG. 11 show process sectional views of the memory cell array 2. (b) of FIG. 10 and (b) of FIG. 11 show process sectional views of the peripheral transistor.

As shown in FIG. 10 and FIG. 11, after the isolation trench is filled with the insulator, the top of the isolation insulator 19 in the memory cell array 2 is etched back. As a result of the etchback, in the memory cell array 2, the top of the isolation insulator 19 is set back closer to the bottom of the semiconductor substrate 10 than the top of the polysilicon layer 21Z. The height of the top of the isolation insulator 19 becomes smaller (lower) than the height of the top of the polysilicon layer 21Z. The height of the top of the isolation insulator 19 becomes larger (higher) than the height of the bottom of the polysilicon layer 21Z. In the memory cell array 2, the side surface of the polysilicon layer 21Z in the channel width direction (row direction, x-direction) is exposed. In the present embodiment, the etchback process for setting back the upper surface of the isolation insulator 19 in the memory cell array 2 is referred to as an EB process.

In the EB process, for example, the polysilicon layer 21Z and the isolation insulator 19X in the peripheral circuit region are covered with a mask layer (e.g., resist mask) 91.

In the present embodiment, an opening is formed in the resist mask 91 on the low breakdown voltage transistor formation region LA so that the top of the isolation insulator 19X is exposed. The opening of the resist mask 91 is formed by the photolithographic technique so that the top of the part of the isolation insulator 19X adjacent to the active region AAL is covered with the mask 91. The opening of the resist mask 91 is patterned to expose the center of the top of the isolation insulator 19X. The dimension of the opening of the resist mask 91 in the width direction of the isolation region is set to be smaller than the width of the isolation insulator 19X.

In the EB process, the upper surface of the isolation insulator 19X in the low breakdown voltage transistor formation region LA is etched in accordance with the patterned resist mask 91 simultaneously with the etching of the upper surface of the isolation insulator 19 in the memory cell array 2.

Therefore, as shown in FIG. 10 and FIG. 11, a recess RC1 is formed in the top of the isolation insulator 19X in the low breakdown voltage transistor formation region LA to correspond to the opening of the resist mask 91.

A part 195 of the isolation insulator 19X adjacent to the active region AAL is covered with the mask 91. Therefore, the upper surface of the part 195 of the isolation insulator 19X adjacent to the side surface of the active region AAL is not set back to the bottom of the semiconductor substrate 10. The height of the upper surface of the part 195 is substantially the same as the height of the upper surface of the polysilicon layer 21Z.

The upper surface of the center 190 of the isolation insulator 19X exposed through the opening is set back to the bottom of the semiconductor substrate 10. The upper surface of the center 190 falls gently (in stages) toward the bottom of the semiconductor substrate 10. The upper surface of the center 190 changes gently because the width of the isolation region is larger than the width of the isolation regions in other element formation regions (e.g., memory cell array).

In the direction perpendicular to the surface of the semiconductor substrate 10, the position of the upper surface of the center 190 is set to be closer to the semiconductor substrate 10 than the position of the upper surface of the part 195 adjacent to the active region AAL. The height of the upper surface of the center 190 at the deepest portion of the recess RC1 is smaller than the height of the upper surface of the part 195 adjacent to the active region AAL. For example, the isolation insulator 19X is etched so that the height of the upper surface of the center 190 at the deepest portion of the recess RC1 is located at the height between the top and bottom of the polysilicon layer 21Z. However, the upper surface of the isolation insulator 19X may be etched so that the height of the upper surface of the center 190 at the deepest portion of the recess RC1 is smaller than the height of the bottom of the polysilicon layer 21Z or the bottom of the gate insulating film 20L.

Thus, the isolation insulator 19X is formed in the isolation region STIL so that the isolation insulator 19X includes the first and second isolation films (the center and the adjacent portion) 190 and 195 different in the height of their tops.

The second isolation film 195 is formed in the second region SS2 of the isolation region STIL adjacent to the active region AAL. The first isolation film 190 is provided in the central region SS1 of the isolation region STIL. The first region SS1 intervenes between two second regions SS2 in the width direction of the isolation region STIL between two active regions. The border between the first region SS1 and the second region SS2 is the portion in which the fall of the upper surface of the isolation film 190 in the center of the isolation insulator 19X starts.

Thus, the volume of the isolation insulator 19X is reduced by the etching of the upper surface of the isolation film 190 in the center of the isolation region. As a result, the stress of the isolation insulator 19X applied to the active region AAL can be lessened.

For example, the upper surfaces of the isolation region and the active region in the high breakdown voltage transistor formation region of the peripheral circuit region are covered with the resist mask 91. In this case, the upper surface of the isolation insulator 19Z in the high breakdown voltage transistor formation region is not etched and is not set back to the bottom of the semiconductor substrate 10.

However, as the low breakdown voltage transistor formation region LA is etched, the isolation insulator in the high breakdown voltage transistor formation region may also be etched, and the first and second isolation films 190 and 195 different in upper surface height may be formed in the isolation region of the high breakdown voltage transistor formation region.

Figure 13:
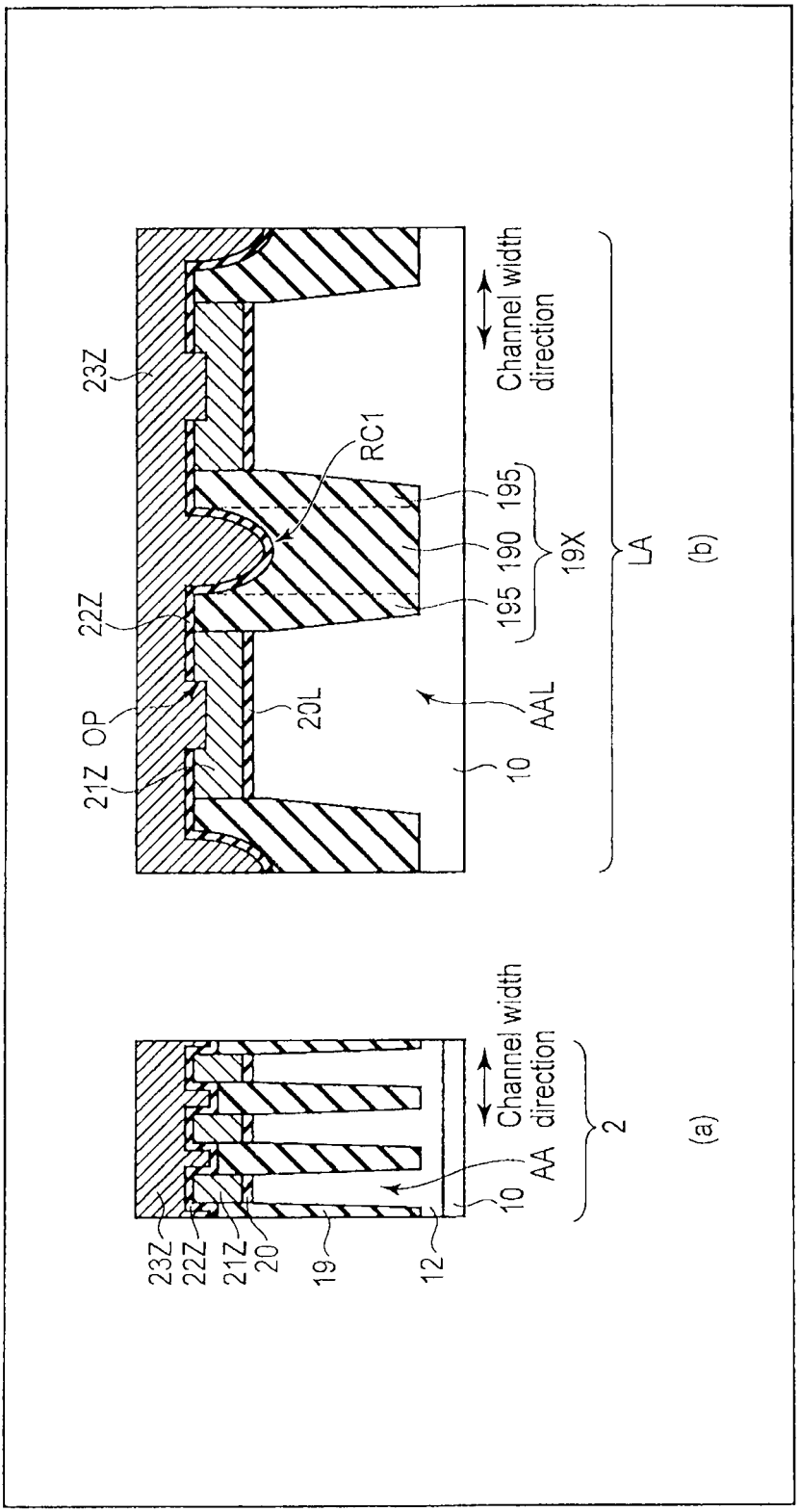
FIG. 13 is a plan view illustrating the method of manufacturing the semiconductor memory according to the first embodiment.

One process in the manufacturing method of the flash memory according to the present embodiment is described with reference to FIG. 12 and FIG. 13. FIG. 12 is a process sectional view showing the memory cell and the peripheral transistor along the channel length direction. FIG. 13 is a process sectional view showing the memory cell and the peripheral transistor along the channel width direction. (a) of FIG. 12 and (a) of FIG. 13 show process sectional views of the memory cell array. (b) of FIG. 13 and (b) of FIG. 13 show process sectional views of the low breakdown voltage transistor.

In the memory cell array 2 and the peripheral transistor formation region LA, an insulator 22Z for forming an intergate insulating film 22 of the memory cell is formed on the polysilicon layer 21Z and the isolation insulators 19 and 19X, for example, by the CVD method. The insulator 22Z is made of one of a silicon oxide film, a multilayer film including a silicon oxide film and a silicon nitride film, a single layer film of a high dielectric constant insulating film (high-k film), and a multilayer film including a high dielectric constant insulating film.

As shown in (a) of FIG. 13, in the memory cell array 2, the insulator 22Z is provided not only on the upper surface of the polysilicon layer 21Z but also on the side surface of the polysilicon layer 21Z. As shown in (b) of FIG. 13, in the low breakdown voltage transistor formation region LA, the insulator 22Z is deposited on the upper surfaces of the isolation films 190 and 195 included in the isolation insulator 19X along the shape of the recess RC1 of the isolation insulator 19X.

In the formation regions of the select transistor and the peripheral transistor, an etching process (referred to as an EI process) for forming an opening in the insulator 22Z is conducted. As a result, an opening OP is formed in the insulator 22Z in the formation regions of the select transistor and the peripheral transistor. The upper surface of the polysilicon layer 21Z under the insulator 22Z is exposed through the formed opening OP.

A conductive layer 23Z is formed on the insulator 22Z, for example, by the CVD method. The conductive layer 23Z is used as a control gate electrode of the memory cell and an upper electrode layer of a gate electrode of each transistor. The conductive layer 23Z contacts the underlying polysilicon layer 21Z through the opening OP of the insulator 22Z.

For example, as shown in (b) of FIG. 13, the recess RC1 of the isolation insulator 19X is filled with the conductive layer 23Z in the low breakdown voltage transistor formation region LA.

Furthermore, a mask layer (not shown) is deposited on the conductive layer 23Z. The mask layer is patterned by the photolithographic technique and the RIE method to match a predetermined gate pattern. In accordance with the patterned mask layer, the layers 21Z, 22Z, and 23Z for forming the gate electrodes of the transistors are subjected to gate fabrication by the RIE method. The conductive layer 23Z, the insulator (intergate insulating film) 22Z, and the polysilicon layer 21Z are sequentially etched. The stack in the memory cell array 2 may be fabricated by the sidewall transfer process.

Thus, as shown in FIG. 3 to FIG. 5, gate electrodes 21, 23, 21A, 23A, LG, and HG having the predetermined gate pattern are formed in the memory cell array, the low breakdown voltage transistor region, and the high breakdown voltage transistor region.

In the memory cell array 2, the gate electrodes 21, 23, 21A, and 23A of the memory cell MC and the select transistor ST are formed to have a line-and-space layout.

In the peripheral transistor formation regions HA and LA, the gate electrodes HG and LG of the transistors HT and LT are formed to extend over the isolation insulators 19X and 19Z that face each other in the channel width direction of the transistors. Therefore, the gate fringe portions as one end and the other of each of the gate electrodes HG and LG of the high breakdown voltage and low breakdown voltage transistors HT and LT are provided on isolation insulators 15H and 15L.

The formed gate electrodes 21, 23, 21A, 23A, LG, and HG are used as masks to form diffusion layers 26, 26A, 26I, and 26H as sources/drains are formed in the semiconductor substrate 10.

For example, sidewall insulating films (not shown) are formed on the side surfaces of the gate electrodes HG and LG of the transistors MC, ST, HT, and LT.

After the mask layers on the gate electrodes 21, 23, 21A, 23A, LG, and HG are removed, an interlayer insulating film 80 is deposited on the semiconductor substrate 10 to cover the gate electrodes 21, 23, HG, and LG.

For example, the top of the interlayer insulating film 80 is removed so that the upper surfaces of the upper electrode layers 23, 23A, 23L, and 23H are exposed. A metal film is deposited on the upper surfaces of the exposed gate electrodes, and the upper surfaces of the gate electrodes and the metal film are subjected to a silicide treatment. As a result, the metal film and the polysilicon films of the upper surfaces of the gate electrodes cause a chemical reaction (silicide reaction) so that a silicide layer is formed.

The contact holes formed in the interlayer insulating film 80 are then filled with contact plugs CP1, CPP1L, CPP2L, CPP1H, and CPP2H so that the contact plugs are connected to the diffusion layers 26, 26A, 26L, and 26H and the gate electrodes 23, 23A, LG, and HG. Further, interlayer insulating films 80 and 81, interconnects M0, MP1L, MP2L, MP1H, and MP2H, a via plug VP, and a bit line BL are sequentially formed by a multilayer interconnect technique.

The flash memory according to the present embodiment is formed by the manufacturing process described above. The low breakdown voltage transistor formation region LA is shown by way of example in FIG. 3 to FIG. 13 to describe the process for forming the isolation insulator that surrounds the active region of the peripheral transistor. However, the formation process shown in FIG. 3 to FIG. 13 is also applicable to the process for forming the isolation insulator that surrounds the active region of the high breakdown voltage transistor formation region.

Regardless of whether a peripheral transistor is a p-channel type or an n-channel type, the peripheral transistor can be formed by a process substantially similar to the manufacturing process described above. Moreover, regardless of whether a peripheral transistor is an enhancement-type or a depression-type, the peripheral transistor can be formed by a process substantially similar to the manufacturing process described above.

In the method of manufacturing the semiconductor memory (e.g., flash memory) according to the present embodiment, the peripheral transistor formation region is formed in the same semiconductor substrate 10 as the memory cell array. In the present embodiment, the isolation insulator 19X including the insulating films (isolation films) 190 and 195 different in upper surface position (height) is formed in the isolation region STIL that surrounds the active region AAL of the peripheral transistor formation region.

The isolation insulator 19X is formed so that the upper surface of the isolation film 190 in the center (first region) SS1 of the isolation region STIL is located lower than the upper surface of the second isolation film 195 provided in the region SS2 adjacent to the active region AAL when the surface of the semiconductor substrate 10 is used as the standard for height.

Thus, in the method of manufacturing the flash memory according to the present embodiment, the isolation film 190 included in the isolation insulator 19X is formed in the isolation trench so that the upper surface of the isolation insulator 19X in the isolation region STI is partly set back to the bottom of the semiconductor substrate 10. Thus, the volume of the isolation insulator 19X in the isolation region STIL can be smaller than when the insulator fills the isolation trench so that the upper surface of the isolation insulator is flat in the isolation region STIL. As a result, in the peripheral transistor formation region LA, the stress applied to the active region AAL from the isolation insulator 19X is reduced. Therefore, the production of crystal defects in the active region AAL resulting from the stress is reduced.

Consequently, in the method of manufacturing the flash memory according to the present embodiment, it is possible to form a semiconductor circuit (e.g., memory) in which the deterioration of element characteristics resulting from crystal defects such as a junction leakage of a field effect transistor can be reduced.

Furthermore, in contrast with the first isolation film 190 in the center of the isolation region, the upper surface of the second isolation film 195 adjacent to the active region AAL is not set back to the bottom of the semiconductor substrate 10. For example, in the direction perpendicular to the surface of the semiconductor substrate 10, the position of the upper surface of the second isolation film 195 substantially corresponds to the position of the upper surface of the lower electrode layer 21L.

Thus, in the method of manufacturing the flash memory according to the present embodiment, the isolation film (insulator) 195 adjacent to the active region AAL included in the isolation insulator 19X covers the side surface of the active region AAL. Accordingly, the suction and penetration of impurity ions generated during the process (e.g., post-process) of manufacturing the channel region and the source/drain regions can be prevented. As a result, in the method of manufacturing the flash memory according to the present embodiment, it is possible to form a memory in which the characteristic deterioration of the transistor is inhibited.

In the peripheral transistor formation region (here, the low breakdown voltage transistor formation region LA), a common process is used to set back the upper surface of the center (the isolation film 190) of the isolation insulator 19X to the semiconductor substrate (the process for forming the recess RC1 in the isolation insulator 19X) and to fabricate the components of the flash memory. In this example, a common process is used to set back the upper surface of the isolation film 190 closer to the bottom of the semiconductor substrate than the upper surface of the isolation film 195 in contact with the active region AAL and to set back the upper surface of the isolation insulator 19 in the memory cell array 2 closer to the bottom of the semiconductor substrate 10 than the upper surface of the charge storage layer.

Therefore, the method of manufacturing the flash memory according to the present embodiment requires no additional process to set the position of the upper surface of the first isolation film 190 in the isolation insulator 19X to be lower than the position of the upper surface of the second isolation film 195.

Consequently, in the method of manufacturing the flash memory according to the present embodiment, there is no addition to the process for manufacturing the flash memory.

In the method of manufacturing the flash memory according to the present embodiment, the volume of the isolation insulator 19X is reduced by the etching of the isolation insulator in the first region SS1. In this case, the upper surface of the isolation insulator 19X can be etched to follow the form of the isolation region STIL. Thus, the method of manufacturing the flash memory according to the present embodiment allows the volume of the isolation insulator 19X to be reduced by the relatively easy layout.

Furthermore, in the method of manufacturing the flash memory according to the present embodiment, the volume of the isolation insulator is reduced by the etching of the isolation insulator. Therefore, the reduction of the volume of the isolation insulator can be adjusted by etching. Thus, the flash memory according to the present embodiment allows the reduction of the volume of the isolation insulator to be increased, a breakdown voltage to be ensured by the isolation insulator, and the elements to be electrically isolated.

As described above, according to Manufacturing method 1 of the semiconductor memory in the first embodiment, it is possible to form a semiconductor memory in which the deterioration of element characteristics resulting from the stress of the isolation insulator can be reduced. Moreover, according to the method of manufacturing the semiconductor memory in the first embodiment, it is possible to provide a semiconductor memory in which the deterioration of operational characteristics is inhibited without addition to the manufacturing process.

<Manufacturing Method 2>

Manufacturing method 2 of the semiconductor memory according to the first embodiment is described with reference to FIG. 14 and FIG. 15. The same processes in Manufacturing method 2 described here as those in Manufacturing method 1 described above are not described in detail and not shown.

In Manufacturing method 1 described above, the upper surface of the first isolation film 190 included in the isolation insulator 19X of the peripheral transistor formation region (e.g., the low breakdown voltage transistor formation region) LA is set back to the bottom of the semiconductor substrate 10 in the same process as the etchback process (EB process) for the upper surface of the isolation insulator 19 in the memory cell array 2.

However, the upper surface of the first isolation film 190 included in the isolation insulator 19X may be set back to the bottom of the semiconductor substrate 10 by the same process as the etching process (EI process) for forming the opening OP in the insulator 22Z between the polysilicon layer 21Z and the conductive layer 23Z in the low breakdown voltage transistor formation region LA.

One process in the manufacturing method of the flash memory according to the present embodiment is described with reference to FIG. 14. FIG. 14 is a process sectional view showing the memory cell and the peripheral transistor along the channel width direction. (a) of FIG. 14 shows a process sectional view of the memory cell array. (b) of FIG. 14 shows a process sectional view of the peripheral transistor (here, low breakdown voltage transistor).

Figure 14:
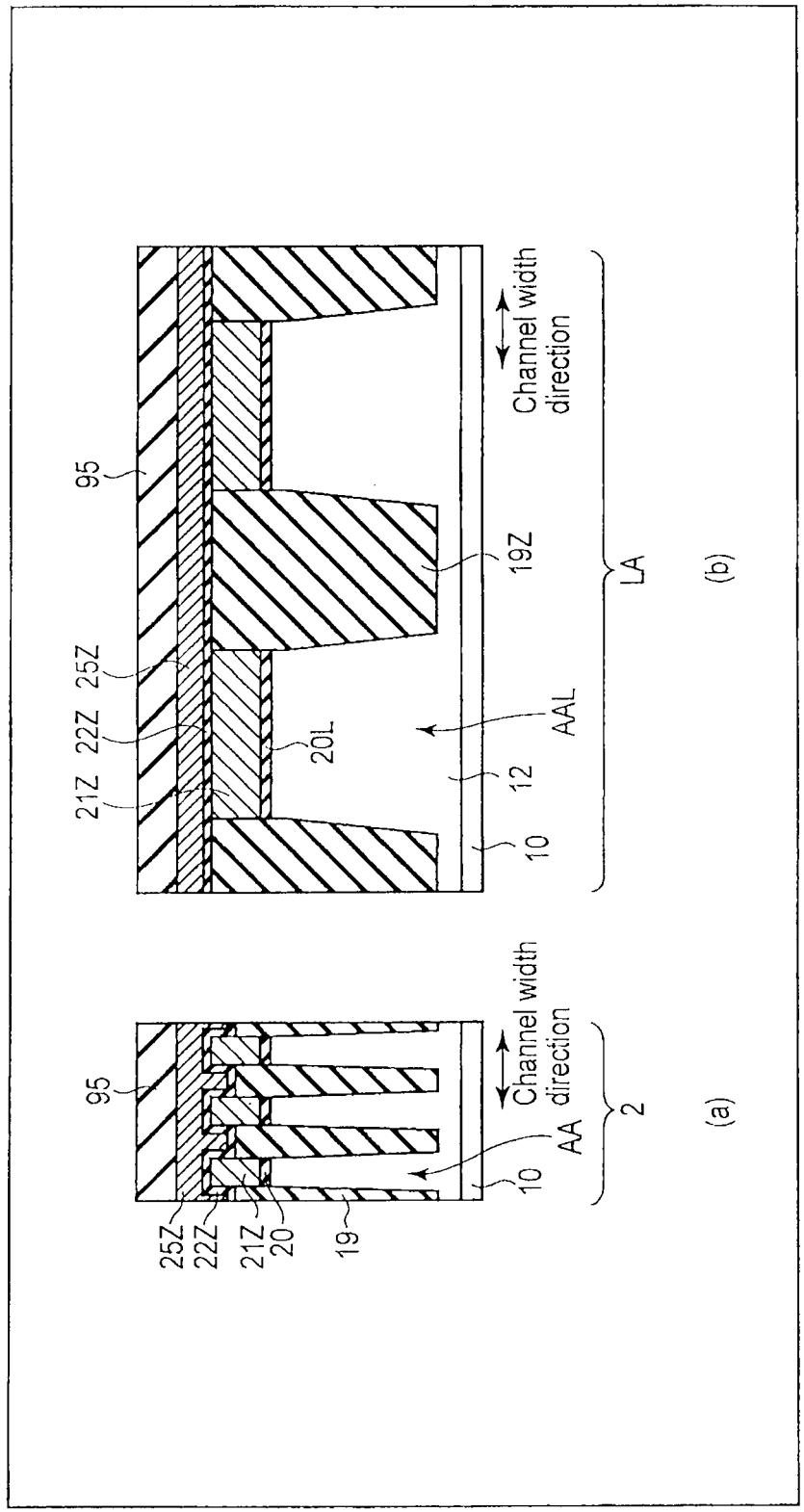
FIG. 14 is a sectional view illustrating the method of manufacturing the semiconductor memory according to the first embodiment.

As shown in FIG. 14, gate insulating films 20 and 20L and a polysilicon layer (charge storage layer) 21Z are formed on a semiconductor substrate 10 by substantially the same process as the process shown in FIG. 6 to FIG. 9. An isolation trench is formed in the semiconductor substrate 10 by the photolithographic technique and the RIE method. The isolation trench is filled with insulators 19 and 19Z.

After the insulators over the upper surface of the polysilicon layer are removed, a mask layer (e.g., resist mask) is formed on the upper surface of the polysilicon layer 21Z in the low breakdown voltage transistor formation region LA and on the upper surface of the isolation insulator 19Z. The upper surface of the memory cell array 2 is not covered with the resist mask, and the upper surface of the isolation insulator 19 is exposed.

After the mask layer over the low breakdown voltage transistor formation region LA is formed, the EB process is conducted. The upper surface of the isolation insulator 19 in the memory cell array 2 is selectively etched by the EB process. As a result, the upper surface of the isolation insulator 19 is set back closer to the bottom of the semiconductor substrate 10 than the upper surface of the polysilicon layer 21Z. At the same time, the upper surface of the isolation insulator 19Z in the low breakdown voltage transistor formation region LA is not set back to the bottom of the semiconductor substrate 10 by the EB process because the upper surface of the isolation insulator 19Z in the low breakdown voltage transistor formation region LA is covered with the mask layer.

After the mask layer is removed, the insulator 22Z as an intergate insulating film is deposited on the polysilicon layer 21Z and the isolation insulators 19 and 19Z.

As described above, the upper surface of the isolation insulator 19Z in the low breakdown voltage transistor formation region LA is not etched by the EB process. Therefore, as shown in (b) of FIG. 14, the insulator 22Z is deposited on the isolation insulator 19Z having a substantially flat upper surface in the low breakdown voltage transistor formation region LA.

A conductive layer 25Z as a part of the component of a control gate electrode and an upper electrode layer is deposited on the insulator 22Z, for example, by the CVD method. A mask layer (e.g., silicon nitride film) 95 is deposited on the conductive layer 25Z.

One process in the manufacturing method of the flash memory according to the present embodiment is described with reference to FIG. 15. FIG. 15 is a process sectional view showing the memory cell and the peripheral transistor along the channel width direction. (a) of FIG. 15 shows a process sectional view of the memory cell array. (b) of FIG. 15 shows a process sectional view of the low breakdown voltage transistor.

Figure 15:
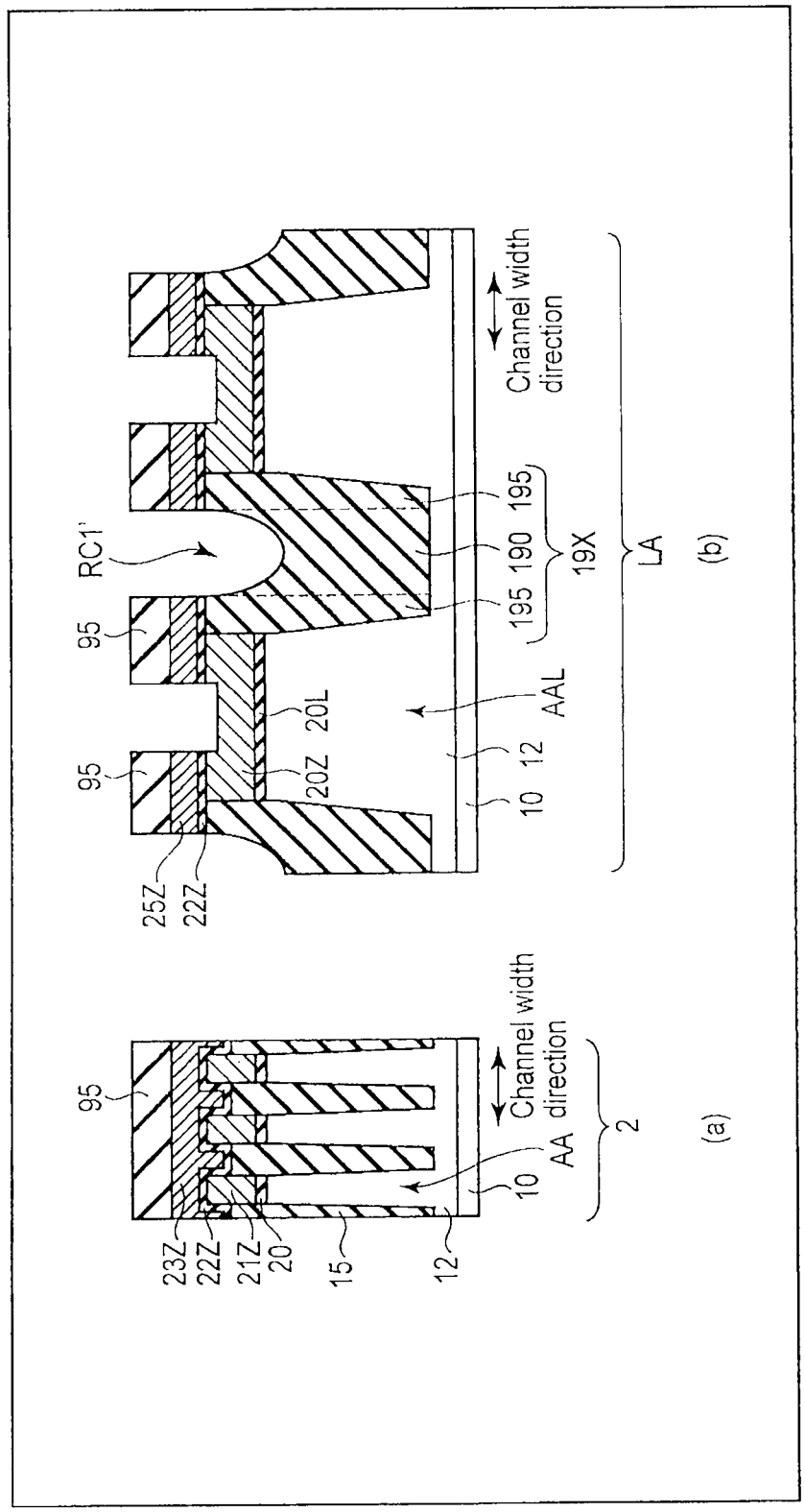
FIG. 15 is a sectional view illustrating the method of manufacturing the semiconductor memory according to the first embodiment.

As shown in FIG. 15, in the formation regions of the select transistor and the peripheral transistor, an opening is formed in a predetermined position of the mask layer 95 to form an opening in the insulator 22Z. In accordance with the mask layer 95 having the opening, the conductive layer 25Z and the insulator 22Z are etched by the EI process.

At the same time, as shown in (b) of FIG. 15, an opening is formed in the mask layer 95 above the isolation insulator 19X in the low breakdown voltage transistor formation region LA. The width of the opening is set to be smaller than the width of the isolation insulator. The opening of the mask layer 95 is formed above the center 190 of the isolation insulator 19X, and the top of a part 195 of the isolation insulator 19X adjacent to the active region AAL is covered with the mask layer 95.

Therefore, the conductive layer and the insulator on the isolation insulator 19X are removed by the EI process, and the exposed part of the isolation insulator 19X is etched. As a result, the part 190 of the isolation insulator 19X corresponding to the position of the opening of the mask layer 95 is set back closer to the bottom of the semiconductor substrate 10 than the part 195 of the isolation insulator 19X covered with the mask layer 95. Thus, the isolation insulator 19X in which the height of the upper surface of the center 190 in the isolation region is smaller than the height of the upper surface of the part 195 adjacent to the active region can be formed in the isolation region STIL in the low breakdown voltage transistor formation region LA. The volume of the isolation insulator 19X is reduced by the etching of the upper surface of the center 190 of the isolation insulator 19X.

After the mask layer 95 is removed, the conductive layer as a part of the component of the control gate electrode and the upper electrode layer is deposited on the conductive layer 25Z, the polysilicon layer 21Z, and the isolation insulator 19X.

Gate fabrication is then conducted by a process substantially similar to the process described in Manufacturing method 1, and gate electrodes of the memory cell and the transistor are formed. Source/drain diffusion layers are formed in the semiconductor substrate 10 in such a manner as to self-align with the formed gate electrodes. Further, an interlayer insulating film, a plug, and an interconnect are formed by the multilayer interconnect technique.

The flash memory according to the present embodiment is formed by the process described above.

Thus, in Manufacturing method 2 of the flash memory shown in FIG. 14 and FIG. 15 as well, the volume of the isolation insulator 19X can be reduced by the process common to the memory cell and the peripheral transistor, and the stress resulting from the isolation insulator 19X and applied to the active region AAL can be reduced. Therefore, the production of crystal defects in the active region AAL resulting from the stress can be reduced.

As described above, the part 195 of the isolation insulator adjacent to the active region AAL is not etched, and the upper surface of the part 195 is kept at the same height as the upper surface of the polysilicon layer (the floating gate electrode and the lower electrode layer). Accordingly, the suction and penetration of impurity ions into the active region AAL can be prevented.

Consequently, Manufacturing method 2 of the flash memory according to the present embodiment can provide advantageous effects similar to those provided by Manufacturing method 1 described above.

Therefore, according to the method of manufacturing the flash memory according to the first embodiment, it is possible to provide a semiconductor memory in which the deterioration of operational characteristics is inhibited without addition to the manufacturing process.

(2) Second Embodiment

A semiconductor memory according to the second embodiment is described with reference to FIG. 16.

Here, the same components, functions, and manufacturing processes as those in the first embodiment are described when necessary. The structures of the memory cell and the select transistor are the same as the structures shown in FIG. 2 to FIG. 4 and are therefore neither described nor shown.

FIG. 16 is a diagram illustrating the structure of the flash memory according to the second embodiment.

(a) of FIG. 16 is a sectional view of a peripheral transistor included in the flash memory according to the present embodiment along the channel length direction. (b) of FIG. 16 is a sectional view of a peripheral transistor included in the flash memory according to the present embodiment along the channel width direction.

As shown in FIG. 16, at the border between a first isolation film 190 and a second isolation film 195 of an isolation insulator 19X, the height of the upper surface of the first isolation film 190 may change sharply (acutely or substantially perpendicularly). In this case, the sectional shape of a recess RC2 of the isolation insulator 19X is rectangular.

For example, dummy layers 22D and 23D are provided in the rectangular recess RC2. In the recess RC2, the insulator 22D of the dummy layer has a depressed sectional shape, and conductor 23D of the dummy layer has a rectangular sectional shape or a downwardly projecting sectional shape.

When there is thus a sharp change between the height of the upper surface of the isolation film 190 in the center of an isolation region and the height of the upper surface of the isolation film 195 adjacent to an active region SSL, the volume of the isolation insulator 19 can be reduced as in the first embodiment. Therefore, the production of crystal defects in the active region AAL resulting from the stress of the isolation insulator 19X can be reduced.

As the isolation film 195 covers a lower electrode layer 21L and the side surface of the active region AAL, the suction and penetration of impurity ions into the active region AAL can be prevented.

For example, there is no need to modify the manufacturing process to make a sharp change in the height of the upper surfaces of the adjacent isolation films 190 and 195 in the flash memory according to the present embodiment. For example, the recess RC2 that sharply changes in depth can be formed in the upper surface of the isolation insulator 19X by reducing the distance between the active regions AAL adjacent to each other across an isolation region STIL, that is, by reducing the width of the isolation insulator 19X.

Thus, there is no addition to the process for manufacturing the flash memory according to the second embodiment as in the first embodiment.

After gate fabrication, the peripheral transistor formation region may be selectively etched to set back the upper surface of the center of the isolation insulator 19X to the bottom of the semiconductor substrate 10.

As described above, the flash memory according to the second embodiment allows the deterioration of element characteristics resulting from the stress of the isolation insulator to be reduced as in the first embodiment. Moreover, according to a method of manufacturing the semiconductor memory in the second embodiment, it is possible to provide a semiconductor memory in which the deterioration of operational characteristics can be inhibited without addition to the manufacturing process.

(3) Third Embodiment

A semiconductor memory according to the third embodiment is described with reference to FIG. 17.

Here, the same components, functions, and manufacturing processes as those in the first and second embodiments are described when necessary. The structures of the memory cell and the select transistor are the same as the structures shown in FIG. 2 to FIG. 4 and are therefore neither described nor shown.

Figure 17:
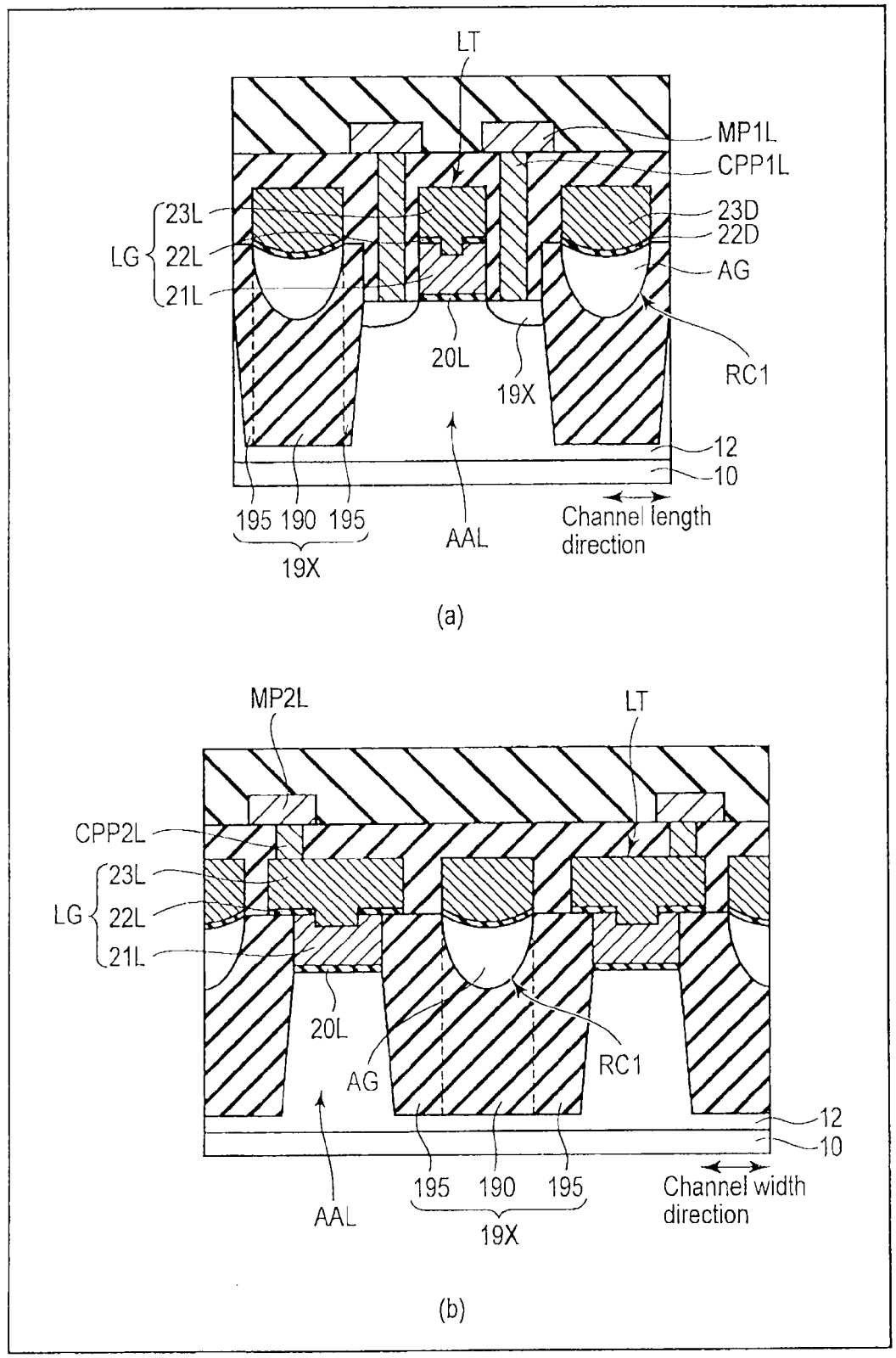
FIG. 17 is a sectional view illustrating the structure of a semiconductor memory according to a third embodiment.

FIG. 17 is a diagram illustrating the structure of the flash memory according to the third embodiment.

(a) of FIG. 17 is a sectional view of a peripheral transistor included in the flash memory according to the present embodiment along the channel length direction. (b) of FIG. 17 is a sectional view of a peripheral transistor included in the flash memory according to the present embodiment along the channel width direction.

As shown in FIG. 17, a recess RC1 in an isolation insulator 19 formed by setting back the upper surface of a first isolation film 190 does not have to be filled with a conductor or an insulator.

In this case, the recess RC1 is filled with air or a vacuum. That is, the inside of the recess RC1 is an air gap AG. For example, dummy layers 22D and 23D are provided over the air gap (also referred to as an air space or cavity) AG. However, the dummy layers 22D and 23D may be removed from the isolation insulator 19. In this case, an interlayer insulating film 80 is provided on the air gap AG and an isolation film 195.

For example, the air gap AG in the recess RC1 of the isolation insulator 19X is formed when a high-viscosity material is formed on the isolation insulator 19X or when the recess RC1 of the isolation insulator 19X has a high aspect ratio.

When the air gap AG is provided in the recess RC1 of the isolation insulator 19, the stress applied to the active region AAL can be more reduced than when the recess RC1 is filled with an insulator or a conductor.

Therefore, the production of crystal defects in the active region AAL resulting from the stress of the isolation insulator 19X can be reduced.

The recess RC1 having a semielliptic sectional shape is provided in the isolation insulator 19 in the example shown in FIG. 17. However, when a rectangular recess RC2 as shown in the second embodiment is provided in the isolation insulator 19, the air gap AG can also be provided in this recess RC2.

As described above, the semiconductor memory according to the third embodiment allows the deterioration of element characteristics resulting from the stress of the isolation insulator to be reduced as in the first and second embodiments. Moreover, according to a method of manufacturing the semiconductor memory in the third embodiment, it is possible to provide a semiconductor memory in which the deterioration of operational characteristics can be inhibited without addition to the manufacturing process.

(4) Fourth Embodiment

A semiconductor memory according to the fourth embodiment is described with reference to FIG. 18 and FIG. 19.

Here, the same components, functions, and manufacturing processes as those in the first to third embodiments are described when necessary. The structures of the memory cell and the select transistor are the same as the structures shown in FIG. 2 to FIG. 4 and are therefore neither described nor shown.

Figure 18:
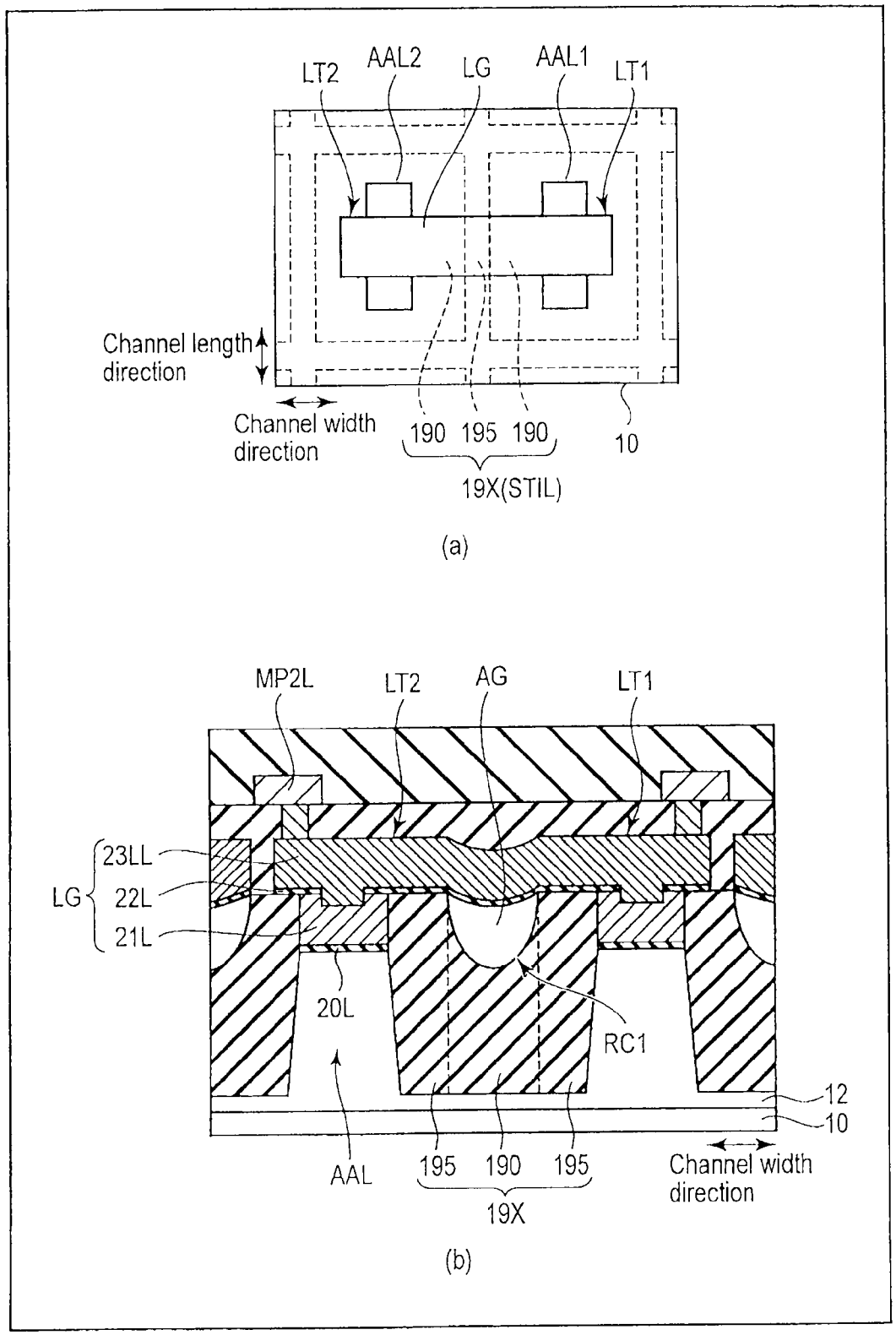
FIG. 18 is a diagram illustrating the structure of a semiconductor memory according to a fourth embodiment.

FIG. 18 is a diagram illustrating the structure of the flash memory according to the fourth embodiment.

(a) of FIG. 18 is a diagram showing the planar layout of a peripheral transistor (e.g., low breakdown voltage transistor) included in the flash memory according to the present embodiment. (b) of FIG. 18 is a sectional view of a peripheral transistor included in the flash memory according to the present embodiment along the channel width direction.

Figure 19:
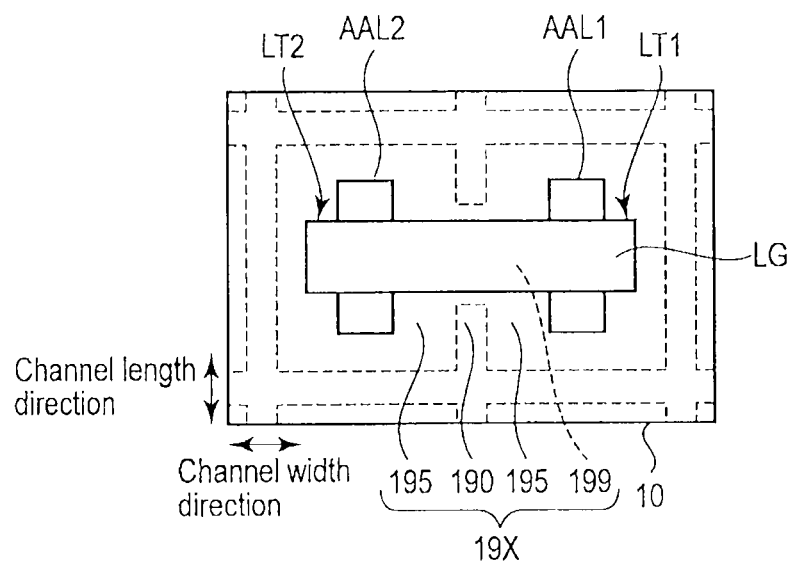
FIG. 19 is a diagram illustrating the structure of the semiconductor memory according to the fourth embodiment.

When a circuit (e.g., CMOS inverter) is formed by using the peripheral transistor, gate electrodes LG of two peripheral transistors (e.g., low breakdown voltage transistors) LT1 and LT2 adjacent in the channel width direction may be connected to each other, as shown in FIG. 18 and FIG. 19.

In this case, an upper electrode layer 23L included in the gate electrode LG is formed to extend over two active regions AAL1 and AAL2 that face each other in the channel width direction across an isolation region STIL. The upper electrode layer 23L is connected to two lower electrode layers 21L in the different active regions AAL.

An upper electrode layer 23LL extends over the isolation region STIL and the two active regions AAL1 and AAL2 in the channel width direction. The upper electrode layer 23LL is provided on isolation films 190 and 195 of an isolation insulator 19X.

For example, an air gap AG is provided between the bottom of the upper electrode layer 23LL and the upper surface of the isolation film 190 in the center of an isolation region STIL1. An insulator 22Z having the same configuration as an intergate insulating film 22Z is provided between the upper electrode layer 23LL and the upper surface of the isolation film 190. However, the upper electrode layer 23LL and an insulator 22L may be provided in a recess RC1 resulting from the difference (step) between the upper surfaces of the isolation films 190 and 195.

In the structure shown in FIG. 18, the upper surface of the isolation film 190 is set back to the bottom of a semiconductor substrate 10 by the EB process.

When the upper electrode layer 23LL is provided on the isolation film 190 having its upper surface set back closer to the bottom of the semiconductor substrate 10 than the adjacent isolation film 195 as in the structure shown in FIG. 18, the production of crystal defects in the active region AAL resulting from the stress of the isolation insulator 19X can be inhibited.

For example, the upper electrode layer 23LL may bend toward the bottom of the semiconductor substrate 10 above the isolation film 190 (above the recess RC1) due to the difference between the upper surfaces of the isolation films 190 and 195.

FIG. 19 is a diagram showing a modification of the planar layout of a peripheral transistor (e.g., low breakdown voltage transistor) included in the flash memory according to the fourth embodiment.

As described above, in order to inhibit the bending of the upper electrode layer 23LL above the recess RC1 of the isolation insulator 19X and the resulting breakage of the upper electrode layer 23LL, the isolation film 190 having a low upper surface does not have to be provided at the intersection of the isolation region STIL and the upper electrode layer 23LL.

In this case, the isolation film 190 having an upper surface lower than the upper surface of the isolation film 195 adjacent to the active region is provided in the isolation region STIL at a place other than the intersection of the isolation region STIL and the upper electrode layer 23LL.

Therefore, in the flash memory according to the present embodiment, the volume of the isolation insulator 19X is reduced even if the upper surface of the third isolation film RC1 is flat at the intersection of the isolation region STIL and the upper electrode layer 23LL, as compared with the structure in which the upper surface of the whole isolation insulator is flat. Thus, the production of crystal defects in the active region AAL resulting from the stress of the isolation insulator 19X can be inhibited.

Furthermore, as the region (isolation insulator) having a flat upper surface is formed under the upper electrode layer 23LL, the breakage of the upper electrode layer 23LL caused by the step on the upper surface of the isolation insulator 19X can be inhibited.

As described above, the semiconductor memory according to the fourth embodiment allows the deterioration of element characteristics resulting from the stress of the isolation insulator to be reduced as in the first and third embodiments. Moreover, according to a method of manufacturing the semiconductor memory in the fourth embodiment, it is possible to provide a semiconductor memory in which the deterioration of operational characteristics can be inhibited without addition to the manufacturing process.

(5) Modifications

Modifications of the semiconductor memory (e.g., flash memory) according to the embodiment are described with reference to FIG. 20 and FIG. 21.

Figure 21:
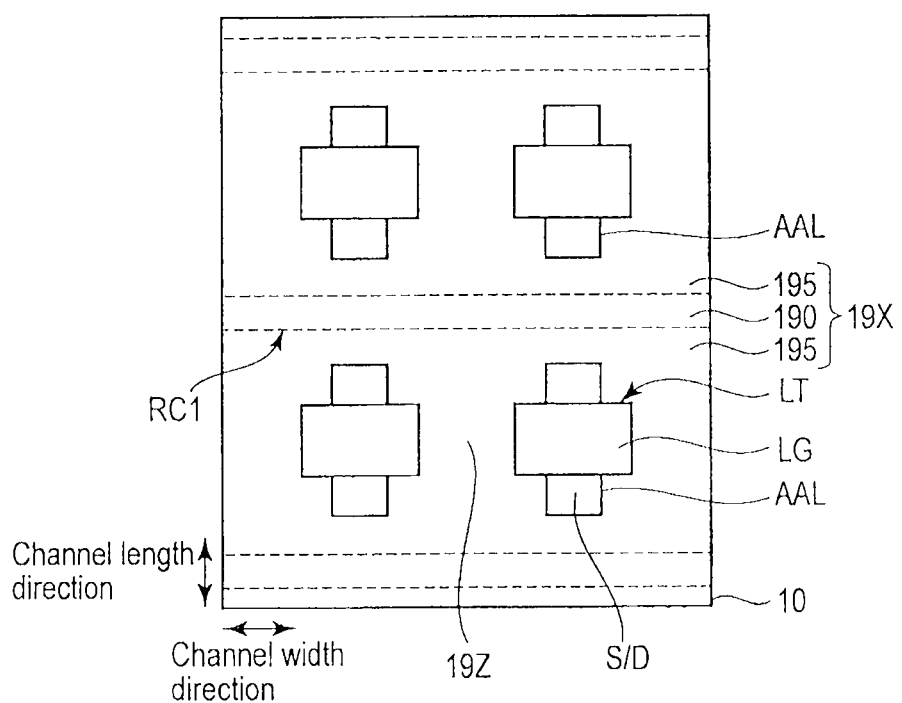
FIG. 21 is a diagram illustrating a modification of the semiconductor memory according to the embodiments.

(a) and (b) of FIG. 20 and FIG. 21 are diagrams showing the planar layout of a peripheral transistor formation region (e.g., low breakdown voltage transistor formation region).

For example, in the isolation insulator 19X having the first and second isolation films, the first isolation film 190 having its upper surface set back to the semiconductor substrate does not have to be provided to surround all the sides of the active region AAH.

In the example shown in (a) of FIG. 20, the first isolation film 190 (center) having its upper surface located closer to the bottom of the semiconductor substrate 10 than the upper surface of the second isolation film (adjacent portion) 195 in the channel length direction of the transistor is not provided in the isolation insulator 19X. The first isolation film 190 is provided in the isolation insulator 19X in the isolation region between the active regions AAL adjacent in the channel width direction of the transistor. The first isolation film 190 is not provided in the isolation region between the active regions AAL adjacent in the channel length direction of the transistor.

The upper surface of the isolation insulator 19Z adjacent to the active region AAL and source/drain regions S/D in the channel length direction of the transistor is flat, for example, as in the isolation insulator 19Z shown in FIG. 5.

In the structure shown in (a) of FIG. 20, the first isolation film 190 and the isolation film RC1 in the isolation insulator 19 have a planar shape linearly extending in the channel length direction.

For example, as compared with crystal defects in the source/drain regions, crystal defects in the channel region may have a greater influence on the characteristic deterioration of the transistor.

Therefore, as shown in (b) of FIG. 20, in the isolation region STIL, the first isolation film 190 may be selectively formed only in a part adjacent to the channel region (gate electrode) via the second isolation film 195.

In this case, the first isolation film 190 and the isolation film RC1 in the isolation insulator 19X have a rectangular planar shape in the isolation region STIL. For example, the rectangular first isolation films 190 are arranged in the channel width direction. In this case, the rectangular first isolation films 190 and the active regions AAL are alternately laid out.

As shown in FIG. 21, the first isolation film 190 may be only provided in the isolation region between the active regions AAL adjacent in the channel length direction of the transistor, in contrast to the example shown in (a) of FIG. 20.

In the structure shown in FIG. 21, the first isolation film 190 and the isolation film RC1 in the isolation insulator 19X have a planar shape linearly extending in the channel width direction of the transistor. In this case, the upper surface of the isolation insulator 19Z is flat in the isolation region adjacent to the active region and the channel region in the channel width direction of the transistor, for example, as in the isolation insulator 19Z shown in FIG. 5. The rectangular first isolation film 190 may be only provided in the region adjacent to the source/drain regions S/D across the second isolation film 195.

The characteristics of the transistor may be improved by the application of compressive stress or tensile stress to the active region (channel region).

Taking this fact into account, the first isolation film 190 having its upper surface located closer to the bottom of the semiconductor substrate 10 than the upper surface of the second isolation film 195 may be selectively provided at a predetermined position in the isolation region STIL, as shown in FIG. 20 and FIG. 21.

The structures shown in FIG. 20 and FIG. 21 can be formed in the EB process or the EI process by properly setting the formation position of the opening in the mask that covers the isolation insulator of the peripheral transistor.

In the structures according to the modifications shown in FIG. 20 and FIG. 21, the deterioration of element characteristics resulting from the stress of the isolation insulator can be reduced as in the semiconductor memories according to the first to fourth embodiments. Moreover, according to a method of manufacturing the semiconductor memory in the modifications of the embodiments, it is possible to provide a semiconductor memory in which the deterioration of operational characteristics is inhibited without addition to the manufacturing process.

[Additions]

The NAND-type flash memory described above is as an example of the semiconductor memory according to the embodiments. However, the semiconductor memory according to the embodiments is not exclusively the NAND-type flash memory, and may be any other semiconductor memory which includes a memory cell and a peripheral transistor having a stack gate structure that includes a charge storage layer.

In the manufacturing method according to the embodiments described above, the memory cell and the peripheral transistor are formed by the common process. However, the memory cell and the peripheral transistor do not have to be formed by the same process if the isolation insulator 19X that includes the first isolation film and also includes the second isolation film between the active region and the first isolation film is formed by the same process as the process for forming the memory cell and the peripheral transistor.

Moreover, the structure of the isolation insulator described in the present embodiment is not exclusively applied to the semiconductor memory. For example, in a logic circuit or an analog circuit, the isolation insulator 19X surrounding the active region may include the first isolation film and also include the second isolation film between the active region and the first isolation film, and the upper surface of the first isolation film may be located closer to the semiconductor substrate than the upper surface of the second isolation film.

These memories and semiconductor integrated circuits also provide advantageous effects similar to those provided by the embodiments described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a memory cell array which is provided in a semiconductor substrate and which includes a first active region surrounded by a first isolation insulator;
   a transistor region which is provided in the semiconductor substrate and which includes a second active region surrounded by a second isolation insulator;
   a memory cell in the memory cell array, the memory cell including a first gate insulating film provided on the first active region, a charge storage layer provided on the first gate insulating film, a first insulator provided on the charge storage layer, and a control gate electrode provided on the charge storage layer via the first insulator; and
   a first transistor in the second active region, the first transistor including a second gate insulating film provided on the second active region, and a first electrode layer provided on the second gate insulating film,
   wherein the second isolation insulator includes a first film, and a second film between the first film and the second active region,
   an upper surface of the first film is located closer to a bottom of the semiconductor substrate than an upper surface of the second film, and
   an air gap is provided between the upper surface of the first film and an interlayer insulating film above the second isolation insulator.

2. The semiconductor memory according to claim 1, wherein
   the first film is adjacent to the second active region via the second film in a channel width direction of the first transistor.

3. The semiconductor memory according to claim 1, wherein
   the first film is adjacent to the second active region via the second film in a channel length direction of the first transistor.

4. The semiconductor memory according to claim 1, wherein
   the first transistor further includes a second electrode layer provided on the first electrode layer via a second insulator having a first opening,
   the second electrode layer extends on the second isolation insulator from the first electrode layer in a channel width direction of the transistor, and
   the first film is located under the second electrode layer via the air gap.

5. The semiconductor memory according to claim 4, further comprising:
   a third electrode layer which is provided above the upper surface of the first film via the air gap in a channel length direction of the transistor and which includes the same material as the material of the second electrode layer.

6. The semiconductor memory according to claim 1, wherein
   the upper surface of the first film includes a portion located closer to the bottom of the semiconductor substrate than an upper surface of the first electrode layer.

7. The semiconductor memory according to claim 1, wherein
   a position of the upper surface of the second film is the same as a position of an upper surface of the first electrode layer.

8. The semiconductor memory according to claim 1, wherein
the second film covers a side surface of the first electrode layer in a channel width direction of the first transistor.

9. The semiconductor memory according to claim 1, wherein
a position of a bottom of the first film is the same as a position of a bottom of the second film.

10. The semiconductor memory according to claim 1, wherein
a thickness of the first film is thinner than a thickness of the second film.

11. The semiconductor memory according to claim 1, wherein
a width of the first film is larger than a width of the second film.

12. The semiconductor memory according to claim 1, wherein
a height of the upper surface of the first film decreases in stages toward a center of the first film from a border between the first film and the second film.

13. The semiconductor memory according to claim 1, wherein
a thickness of the second gate insulating film is thicker than the thickness of a first gate insulating film.

14. The semiconductor memory according to claim 1, further comprising:
a third active region which is provided in the transistor region and which is surrounded by a third isolation insulator;
a second transistor in the third active region, the second transistor including a third gate insulating film provided on the third active region, and a third gate electrode layer provided on the third gate insulating film, the third gate insulating film having a thickness thicker than a thickness of the first gate insulating film,
wherein the position of an upper surface of the third isolation insulator corresponds to an height of the upper surface of the second film.

15. The semiconductor memory according to claim 1, wherein the first transistor further includes a second electrode layer provided on the first electrode layer via a second insulator having a first opening, the second electrode layer and the second insulator extend on the second isolation insulator from the first electrode layer, and the first film is located under the second electrode layer and the second insulator via the air gap.

16. The semiconductor memory according to claim 15, wherein the second insulator includes a silicon nitride film, or a high dielectric constant insulating film.

17. The semiconductor memory according to claim 1, wherein the first transistor further includes a second electrode layer provided on the first electrode layer via a second insulator having a first opening, the second electrode layer and the second insulator extend on the second isolation insulator from the first electrode layer in a channel width direction of the transistor, and the first film is located under the second electrode layer and the second insulator via the air gap.

18. The semiconductor memory according to claim 17, wherein the second insulator includes a silicon nitride film, or a high dielectric constant insulating film.

* * * * *